United States Patent
Nakada

(10) Patent No.: US 10,468,577 B2
(45) Date of Patent: Nov. 5, 2019

(54) METHOD FOR MANUFACTURING MAGNESIUM-BASED THERMOELECTRIC CONVERSION MATERIAL, METHOD FOR MANUFACTURING MAGNESIUM-BASED THERMOELECTRIC CONVERSION ELEMENT, MAGNESIUM-BASED THERMOELECTRIC CONVERSION MATERIAL, MAGNESIUM-BASED THERMOELECTRIC CONVERSION ELEMENT, AND THERMOELECTRIC CONVERSION DEVICE

(71) Applicant: MITSUBISHI MATERIALS CORPORATION, Tokyo (JP)

(72) Inventor: Yoshinobu Nakada, Ageo (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 16/076,868

(22) PCT Filed: Feb. 22, 2017

(86) PCT No.: PCT/JP2017/006581
§ 371 (c)(1),
(2) Date: Aug. 9, 2018

(87) PCT Pub. No.: WO2017/146095
PCT Pub. Date: Aug. 31, 2017

(65) Prior Publication Data
US 2019/0067548 A1 Feb. 28, 2019

(30) Foreign Application Priority Data
Feb. 24, 2016 (JP) .................. 2016-033344

(51) Int. Cl.
*H01L 35/34* (2006.01)
*B22F 3/15* (2006.01)
(Continued)

(52) U.S. Cl.
CPC ............ *H01L 35/34* (2013.01); *B22F 3/1039* (2013.01); *B22F 3/15* (2013.01); *C22C 1/05* (2013.01);
(Continued)

(58) Field of Classification Search
CPC .. C22C 1/053; C22C 1/05; C22C 3/00; C22C 1/1084; H01L 35/30; H01L 35/14;
(Continued)

(56) References Cited

U.S. PATENT DOCUMENTS

2005/0016638 A1* 1/2005 Kondoh .................. C01B 33/06
148/420
2005/0089435 A1* 4/2005 Kondoh ................ C22C 1/1078
419/19
(Continued)

FOREIGN PATENT DOCUMENTS

| JP | 2011-249742 A | 12/2011 |
| JP | 2012-253229 A | 12/2012 |

(Continued)

OTHER PUBLICATIONS

J. R. Szczech et al., "Mg2Si nanocomposite converted from diatomaceous earth as a potential thermoelectric nanomaterial," Journal of Solid State Chemistry, 2008, vol. 181, pp. 1565-1570. (cited in the ISR).

(Continued)

*Primary Examiner* — Golam Mowla
(74) *Attorney, Agent, or Firm* — Locke Lord LLP

(57) ABSTRACT

A method for manufacturing a magnesium-based thermoelectric conversion material of the present invention
(Continued)

includes a raw material-forming step of forming a raw material for sintering by adding silicon oxide in an amount within a range equal to or greater than 0.5 mol % and equal to or smaller than 13.0 mol % to a magnesium-based compound, and a sintering step of heating the raw material for sintering at a temperature within a range equal to or higher than 750° C. and equal to or lower than 950° C. while applying pressure equal to or higher than 10 MPa to the raw material for sintering so as to form a sintered substance.

16 Claims, 8 Drawing Sheets

(51) Int. Cl.
    *B22F 3/10*     (2006.01)
    *C22C 1/05*     (2006.01)
    *C22C 23/00*     (2006.01)
    *H01L 35/26*     (2006.01)
    *H01L 35/32*     (2006.01)
    *H01L 35/22*     (2006.01)
    *H01L 35/30*     (2006.01)
    *B22F 3/17*     (2006.01)
    *B22F 3/18*     (2006.01)
    *B22F 3/20*     (2006.01)
    *B22F 3/105*     (2006.01)

(52) U.S. Cl.
    CPC .............. *C22C 23/00* (2013.01); *H01L 35/22* (2013.01); *H01L 35/26* (2013.01); *H01L 35/30* (2013.01); *H01L 35/32* (2013.01); *B22F 2003/1051* (2013.01); *B22F 2003/175* (2013.01); *B22F 2003/185* (2013.01); *B22F 2003/208* (2013.01)

(58) Field of Classification Search
    CPC ......... H01L 35/26; H01L 35/32; H01L 35/34; H01L 35/22; C04B 2235/3891; C04B 35/58085; C04B 35/645; C04B 35/6455; C04B 2235/3418; C04B 2235/40; C04B 2235/401; C04B 2235/402; C04B 2235/407; C04B 2235/408; C04B 2235/421; C04B 2235/428; C04B 2235/5436; C04B 2235/6581; C04B 2235/666; C04B 2235/728; C04B 2235/761; C04B 2235/80; C04B 2235/96; C01B 33/06; B22F 3/1039; B22F 2003/1051; B22F 2003/175; B22F 3/15; B22F 2003/185; B22F 2003/208
See application file for complete search history.

(56) References Cited

U.S. PATENT DOCUMENTS

| | | | |
|---|---|---|---|
| 2010/0051081 A1* | 3/2010 | Iida | B09B 3/005 136/240 |
| 2012/0025130 A1* | 2/2012 | Rowe | H01L 35/16 252/71 |
| 2012/0025154 A1* | 2/2012 | Rowe | B82Y 30/00 252/519.4 |
| 2012/0199797 A1* | 8/2012 | Rowe | H01L 35/16 252/519.4 |
| 2013/0186448 A1 | 7/2013 | Ranalli et al. | |

FOREIGN PATENT DOCUMENTS

| | | |
|---|---|---|
| JP | 2012-533972 A | 12/2012 |
| JP | 2014-165247 A | 9/2014 |
| JP | 2014-165260 A | 9/2014 |

OTHER PUBLICATIONS

International Search Report dated May 23, 2017, issued for PCT/JP2017/006581 and English translation thereof.

* cited by examiner (b) 700X COMPOSITIONAL IMAGE OF OXYGEN (a) 700X COMPOSITIONAL IMAGE OF MAGNESIUM (c) 700X COMPOSITIONAL IMAGE OF SILICON

US 10,468,577 B2

METHOD FOR MANUFACTURING MAGNESIUM-BASED THERMOELECTRIC CONVERSION MATERIAL, METHOD FOR MANUFACTURING MAGNESIUM-BASED THERMOELECTRIC CONVERSION ELEMENT, MAGNESIUM-BASED THERMOELECTRIC CONVERSION MATERIAL, MAGNESIUM-BASED THERMOELECTRIC CONVERSION ELEMENT, AND THERMOELECTRIC CONVERSION DEVICE

TECHNICAL FIELD

The present invention relates to a method for manufacturing a thermoelectric conversion material based on magnesium silicide, magnesium tin, and magnesium germanium having excellent thermoelectric conversion efficiency, a method for manufacturing a thermoelectric conversion element based on magnesium silicide, magnesium tin, and magnesium germanium, a thermoelectric conversion material based on magnesium silicide, magnesium tin, and magnesium germanium, a thermoelectric conversion element based on magnesium silicide, magnesium tin, and magnesium germanium in which the thermoelectric conversion material is used, and a thermoelectric conversion device.

Priorities are claimed on Japanese Patent Application No. 2016-033344, filed on Feb. 24, 2016, and Japanese Patent Application No. 2017-023093, filed on Feb. 10, 2017, the content of which is incorporated herein by reference.

BACKGROUND ART

A thermoelectric conversion element is an electronic element which can carry out interconversion between heat and electricity, known as the Seebeck effect or the Peltier effect. The Seebeck effect is an effect of converting heat energy into electric energy. The Seebeck effect is a phenomenon in which an electromotive force is produced in a case where a temperature difference is caused between both ends of a thermoelectric conversion material. The electromotive force depends on the characteristics of the thermoelectric conversion material. In recent years, thermoelectric generation using the effect has been actively developed.

In contrast, the Peltier effect is an effect of converting electric energy into heat energy. The Peltier effect is a phenomenon in which a temperature difference is caused between both ends of a thermoelectric conversion material in a case where electrodes and the like are formed at both ends of the thermoelectric conversion material, and a potential difference is caused between the electrodes. An element having such an effect is particularly called a Peltier element, and is used for cooling or temperature control of precision instruments, compact refrigerators, and the like (for example, see Patent Document 1).

In recent years, attention has been paid to a technique of effectively utilizing waste heat by using a thermoelectric generation module exploiting the Seebeck effect. For example, a technique has been suggested in which a thermoelectric generation module using the Seebeck element is mounted on a discharge pipe for an exhaust gas from an automobile engine or on a wall surface of a pipe through which a high-temperature fluid flows in a factory, a plant, and the like while a thermoelectric conversion member such as a heatsink is mounted on the other surface of the thermoelectric generation module for heat dissipation so as to use the heat of the pipe by converting it into electric power.

As the aforementioned thermoelectric generation device, for example, a device is known which includes cylindrical thermoelectric generation devices each having a plurality of built-in modularized thermoelectric conversion elements, in which the thermoelectric generation devices are vertically disposed in one path through which an exhaust gas or cooling water passes, another path through which cooling water or an exhaust gas passes is formed on the inside of each of the thermoelectric generation devices, and thermoelectric generation is carried out by exploiting the temperature difference between the inside and the outside of the plurality of cylindrical thermoelectric generation units lining up in parallel (for example, see Patent Document 2).

Furthermore, a thermoelectric conversion system is known which includes cylindrical thermoelectric generation devices each having a plurality of built-in modularized thermoelectric conversion elements, in which a fin is mounted on the thermoelectric generation devices so as to make cartridges, and the plurality of thermoelectric generation devices made into cartridges are arranged in parallel (for example, see Patent Document 3).

CITATION LIST

Patent Document

[Patent Document 1] Japanese Unexamined Patent Application, First Publication No. 2011-249742
[Patent Document 2] Published Japanese Translation No. 2012-533972 of the PCT International Publication
[Patent Document 3] United States Patent Application, Publication No. 2013/0186448

DISCLOSURE OF INVENTION

Technical Problem

However, the aforementioned thermoelectric conversion materials of the related art in which thermoelectric generation elements are used as described in Patent Document 1 to Patent Document 3 have problems of low thermoelectric conversion efficiency and weak mechanical strength. Therefore, in order to generate necessary electric power, a large-area thermoelectric generation element is required. In addition, in a case where the thermoelectric conversion materials are used as an on-vehicle device for generating power from the waste heat of an exhaust gas from an automobile engine, due to the weak mechanical strength, the thermoelectric conversion materials may be damaged by the traveling vibration of the vehicle and the like.

The present invention is based on the circumstances described above, and an object thereof is to provide a method for manufacturing a magnesium-based thermoelectric conversion material having high thermoelectric conversion efficiency and excellent mechanical strength, a magnesium-based thermoelectric conversion material, a magnesium-based thermoelectric conversion element using the magnesium-based thermoelectric conversion material, and a thermoelectric conversion device.

Solution to Problem

In order to achieve the aforementioned object, the method for manufacturing a magnesium-based thermoelectric conversion material of the present invention includes a raw material-forming step of forming a raw material for sintering by adding silicon oxide in an amount within a range equal to or greater than 0.5 mol % and equal to or smaller than 13.0 mol % to a magnesium-based compound, and a sintering step of heating the raw material for sintering at a maximum temperature within a range equal to or higher than 750° C. to equal to or lower than 950° C. while applying pressure equal to or higher than 10 MPa to the raw material for sintering so as to form a sintered substance.

Presumably, according to the method for manufacturing a magnesium-based thermoelectric conversion material of the present invention, because sintering is performed by adding silicon oxide to the magnesium-based compound, the following phenomenon may occur.

By the decomposition of the magnesium-based compound, Mg is generated. By causing an oxidation-reduction reaction with the silicon oxide, Mg permeates and is diffused in the silicon oxide, and as a result, SiMgO is formed. At this time, because the magnesium-based compound has been decomposed, Si remains after Mg permeates and is diffused in the silicon oxide. Furthermore, MgO is generated in the silicon oxide in some cases.

Because Mg permeates and is diffused in the silicon oxide, surplus Si is generated by the amount of permeating Mg. Consequently, Si is pushed out of the silicon oxide and is diffused to the outside. As a result, a thermoelectric conversion material can be manufactured in which grains of a reaction product, including a modified product containing SiMgO (having the same size and shape as those of the silicon oxide added) and a high-concentration silicon region formed on the periphery of the modified product, are formed.

Depending on the size of the aforementioned modified product, a portion of the silicon oxide added remains in the modified product in some cases, or more MgO is present in the modified product than SiMgO in some cases.

In addition, due to the reaction between Mg and the oxygen of the oxidized layer of the surface of the magnesium-based compound grains before sintering, MgO is formed on the grain boundary of the magnesium-based compound in some cases.

Furthermore, because the dopant-containing high-concentration silicon region in the magnesium-based compound crosses the crystal grain boundary of the magnesium-based compound, the electric resistance of the crystal grain boundary is reduced, and hence the electric resistance of the magnesium-based thermoelectric conversion material is reduced.

As the silicon oxide added, it is possible to use $SiO_x$ (x=1 to 2) such as amorphous $SiO_2$, cristobalite, quartz, tridymite, coesite, stishovite, seifertite, or shocked quartz.

The thermoelectric conversion material containing the reaction product has high thermoelectric conversion efficiency and excellent mechanical strength.

In a case where the amount of the silicon oxide added is less than 0.5 mol %, no electric resistance reducing effect is exerted, and the mechanical strength is not improved. In a case where the amount of the silicon oxide added is greater than 13.0 mol % and hence the amount of the silicon oxide increases, the amount of Mg that permeates and is diffused in the silicon oxide increases, and the amount of MgO in the modified product increases. Accordingly, the electric resistance reducing effect is reduced.

In a case where the applied pressure is less than 10 MPa, sintering becomes insufficient, and hence the electric resistance increases.

In a case where the heating temperature is less than 750° C., sintering becomes insufficient, and hence the electric resistance increases. In a case where the heating temperature is higher than 950° C., a portion of the sintered substance is melted again and cracks.

The magnesium-based compound is preferably any one of $Mg_xSi_y$, $Mg_2Si_{1-x}Ge_x$, and $Mg_2Si_{1-x}Sn_x$.

The use of $Mg_xSi_y$, $Mg_2Si_{1-x}Ge_x$, or $Mg_2Si_{1-x}Sn_x$ makes it possible to easily form the grains of the reaction product in a case where sintering is performed by adding the silicon oxide.

It is preferable that the aforementioned raw material for sintering further contain, as a dopant, at least one kind of element among Li, Na, K, B, Al, Ga, In, N, P, As, Sb, Bi, Ag, Cu, and Y.

In a case where the raw material for sintering further contains at least one kind of element among the above, the thermoelectric conversion material can be made into a specific semiconductor type, that is, an n-type thermoelectric conversion material or a p-type thermoelectric conversion material.

It is preferable that the aforementioned sintering step be performed by any of a hot pressing method, a hot isostatic pressing method, an energizing sintering method, a discharge plasma sintering method, a hot rolling method, a hot extrusion method, and a hot forging method.

In a case where these sintering methods are used, by heating powder, which is obtained by adding the silicon oxide to the magnesium-based compound such as a magnesium silicide-based compound, while applying pressure thereto, the thermoelectric conversion material as a sintered substance can be easily formed.

It is preferable that the sintering step be performed in a vacuum atmosphere under a pressure equal to or lower than 5 Pa or in an inert gas atmosphere.

In a case where the sintering step is performed in the aforementioned atmosphere, it is possible to prevent the structure alteration caused by the mixing of impurities into the thermoelectric conversion material formed of the sintered substance obtained by adding the silicon oxide to the magnesium-based compound such as a magnesium silicide-based compound or caused by the oxidation resulting from components other than the silicon oxide that is intentionally added.

A method for manufacturing a magnesium-based thermoelectric conversion element such as a magnesium silicide-based thermoelectric conversion element of the present invention includes an electrode-forming step of joining electrodes to one surface and the other surface, facing the one surface, of the aforementioned sintered substance obtained by the method for manufacturing a magnesium-based thermoelectric conversion material of the present invention described above respectively.

According to the method for manufacturing a magnesium-based thermoelectric conversion element such as a magnesium silicide-based thermoelectric conversion element of the present invention, Mg generated by the decomposition of the magnesium-based compound causes an oxidation-reduction reaction with the silicon oxide. As a result, Mg permeates and is diffused in the silicon oxide, and hence SiMgO is formed. In some cases, MgO is formed in the silicon oxide. Because Mg permeates and is diffused in the silicon oxide, surplus Si is generated by the amount of the permeating Mg. Consequently, Si is pushed out of the silicon oxide and is diffused to the outside. As a result, it is possible to manufacture a thermoelectric conversion element including a thermoelectric conversion material in which grains of a reaction product, including a modified product containing SiMgO (having the same size and shape as those of the silicon oxide added) and a high-concentration silicon region formed on the periphery of the modified product, are formed.

The thermoelectric conversion material containing the reaction product has low electric resistance, high thermoelectric conversion efficiency, and excellent mechanical strength. Therefore, a thermoelectric conversion element using this material has excellent thermoelectric conversion characteristics and excellent vibration resistance.

A magnesium-based thermoelectric conversion material of the present invention is a magnesium-based thermoelectric conversion material including a sintered substance of a magnesium-based compound. In the sintered substance, grains of a reaction product are present. Each of the grains of the reaction product is constituted with a modified product and a high-concentration silicon region formed on the periphery of the modified product. The modified product contains magnesium at a concentration within a range equal to or higher than 30 at % and equal to or lower than 50 at %, silicon at a concentration within a range equal to or higher than 0 at % and equal to or lower than 20 at %, and oxygen at a concentration within a range equal to or higher than 40 at % and equal to or lower than 55 at %. Furthermore, a number density of the grains of the reaction product is within a range equal to or higher than 50 grains/mm$^2$ and equal to or lower than 700 grains/mm$^2$. It is considered that in the grains of the reaction product constituted with the modified product and the high-concentration silicon region formed on the periphery of the modified product, the high-concentration silicon region may be doped with Sb or the like, and hence an n-type highly conductive layer may be formed. It is considered that the n-type highly conductive layer may extend to and cross the crystal grain boundary of the magnesium-based thermoelectric conversion material, and hence the electric resistance of the crystal grain boundary may be reduced.

The high-concentration silicon region forms a network in the magnesium-based thermoelectric conversion material, and this is considered as one of the reasons why the electric resistance of the crystal of the magnesium-based thermoelectric conversion material is greatly reduced.

Accordingly, in a case where the number density of the grains of the reaction product is equal to or lower than 50 grains/mm$^2$, each of the high-concentration silicon regions may be isolated and fail to constitute a network, and hence the overall electric resistance of the crystals of the magnesium-based thermoelectric conversion material may not be reduced.

In contrast, in a case where the number density is equal to or higher than 700 grains/mm$^2$, the number of grains of the reaction product having the modified product containing SiMgO or MgO having high thermal conductivity increases. Accordingly, the overall electric resistance of the crystals of the magnesium-based thermoelectric conversion material may increase, the thermal conductivity may increase, and hence a dimensionless figure of merit of the thermoelectric conversion material may decrease.

According to the magnesium-based thermoelectric conversion material such as a magnesium silicide-based thermoelectric conversion material of the present invention, the grains of the reaction product, which is constituted with the modified product containing SiMgO and the high-concentration silicon region formed on the periphery of the modified product, are formed. Therefore, a thermoelectric conversion material having high thermoelectric conversion efficiency and excellent mechanical strength can be realized.

A average grain size of the grains of the reaction product is preferably equal to or greater than 0.5 μm and equal to or smaller than 100 μm.

In a case where the average grain size is within the above range, it is possible to uniformly disperse the grains of the reaction product contained in the thermoelectric conversion material and to reduce the variation of the thermoelectric conversion characteristics or the strength characteristics of the magnesium-based thermoelectric conversion material.

In a case where the average grain size is less than 0.5 μm, the amount of Si diffused from one silicon oxide molecule is reduced. Consequently, the high-concentration silicon regions may be reduced and isolated and fail to constitute the aforementioned network, and hence the electric resistance of the magnesium-based thermoelectric conversion material may not be reduced. In a case where the average grain size is larger than 100 μm, the grains of the reaction product may be isolated and fail to constitute the network, and hence the overall electric resistance of the crystals of the magnesium-based thermoelectric conversion material may not be reduced.

In the magnesium-based thermoelectric conversion material of the present invention, it is preferable that on a grain boundary of a grain of the magnesium-based compound, a Si-rich phase having a Si concentration higher than that in the grain of the magnesium-based compound be formed.

In this case, due to the presence of the Si-rich phase formed on the grain boundary of the grain of the magnesium-based compound, the electric resistance can be further reduced. In a case where the Si-rich phase contains a trace of Sb, Al, and the like, due to the effect of the dopant, the electric resistance can be further reduced.

In the magnesium-based thermoelectric conversion material of the present invention, it is preferable that a lattice constant difference obtained by subtracting a lattice constant of raw material powder formed of the magnesium-based compound from a lattice constant of the magnesium-based thermoelectric conversion material (lattice constant of magnesium-based thermoelectric conversion material−lattice constant of raw material powder formed of magnesium-based compound) be equal to or greater than 0.0005 angstrom (Å).

In this case, because the lattice constant difference is large, and crystals are distorted, free electrons easily move between lattices, and accordingly, the electric resistance can be further reduced.

A magnesium-based thermoelectric conversion element of the present invention includes the aforementioned magnesium-based thermoelectric conversion material of the present invention and electrodes which are joined to one surface and the other surface, facing the one surface, of the magnesium-based thermoelectric conversion material respectively.

According to the magnesium-based thermoelectric conversion element of the present invention, grains of a reaction product, which is constituted with a modified product containing SiMgO and a high-concentration silicon region formed on the periphery of the modified product, are formed. Therefore, a magnesium-based thermoelectric conversion element having high thermoelectric conversion efficiency and excellent mechanical strength can be realized.

It is preferable that the magnesium-based thermoelectric conversion element be a Seebeck element in which the one surface or the other surface of the magnesium-based thermoelectric conversion material is heated such that a potential difference is caused between the electrodes.

In a case where the magnesium-based thermoelectric conversion element of the present invention is applied to a Seebeck element, a Seebeck element which can more efficiently generate power by a small temperature difference and has excellent vibration resistance can be realized.

It is preferable that the magnesium-based thermoelectric conversion element be a Peltier element in which voltage is applied between the electrodes such that the one surface or the other surface of the magnesium-based thermoelectric conversion material is cooled.

In a case where the magnesium-based thermoelectric conversion element of the present invention is applied to a Peltier element, a Peltier element in which cooling can be more efficiently performed by a small potential difference and which has excellent vibration resistance can be realized.

A thermoelectric conversion device of the present invention includes a plurality of the magnesium-based thermoelectric conversion elements of the present invention, in which the magnesium-based thermoelectric conversion elements are arranged and electrically connected to each other in series through the aforementioned electrodes.

The thermoelectric conversion device of the present invention includes the magnesium-based thermoelectric conversion material in which the grains of the reaction product, which is constituted with the modified product containing SiMgO and the high-concentration silicon region formed on the periphery of the modified product, are formed. Therefore, a thermoelectric conversion device having high thermoelectric conversion efficiency and excellent mechanical strength can be realized.

It is preferable that the magnesium-based thermoelectric conversion element include p-type thermoelectric conversion elements and n-type thermoelectric conversion elements including the magnesium-based thermoelectric conversion material containing a donor, in which the n-type thermoelectric conversion elements and the p-type thermoelectric conversion elements are alternately connected to each other in series.

In a case where the p-type thermoelectric conversion elements and the n-type thermoelectric conversion elements are alternately connected to each other in series, a thermoelectric conversion device having further improved thermoelectric conversion efficiency can be realized.

It is preferable that the magnesium-based thermoelectric conversion element be formed of any one of n-type thermoelectric conversion elements including the magnesium-based thermoelectric conversion material containing a donor and p-type thermoelectric conversion elements including the magnesium-based thermoelectric conversion material containing an acceptor, in which the n-type thermoelectric conversion elements or the p-type thermoelectric conversion elements are connected to each other in series.

In a case where the thermoelectric conversion device is formed by arranging a plurality of thermoelectric conversion elements of the same type of semiconductor and connecting the elements to each other in series, it is not necessary to use thermoelectric conversion elements of a plurality of different types of semiconductors, and a thermoelectric conversion device of a lower cost can be realized.

Advantageous Effects of Invention

According to the method for manufacturing a magnesium-based thermoelectric conversion material, the method for manufacturing a magnesium-based thermoelectric conversion element, the magnesium-based thermoelectric conversion material, the magnesium-based thermoelectric conversion element, and the thermoelectric conversion device of the present invention, it is possible to provide a magnesium-based thermoelectric conversion material having high thermoelectric conversion efficiency and excellent mechanical strength and to provide a magnesium-based thermoelectric conversion element and a thermoelectric conversion device in which the magnesium-based thermoelectric conversion material is used.

BEST MODE FOR CARRYING OUT THE INVENTION

Figure 1:
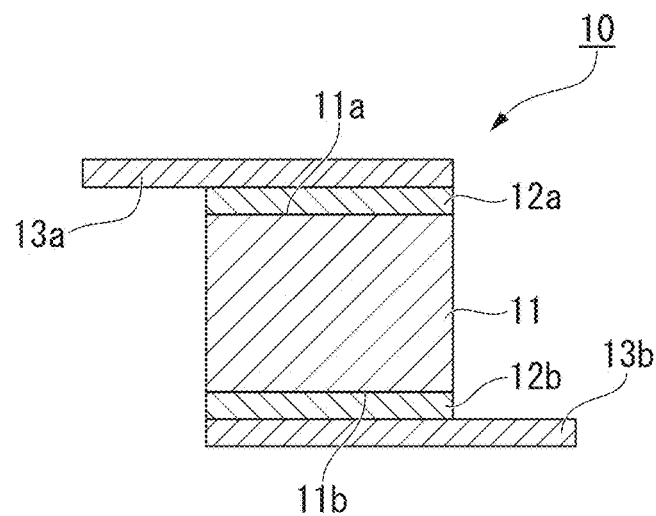
FIG. 1 is a cross-sectional view showing a magnesium-based thermoelectric conversion material of an embodiment of the present invention and a magnesium-based thermoelectric conversion element in which the magnesium-based thermoelectric conversion material is used.

Hereinafter, the method for manufacturing a magnesium-based thermoelectric conversion material, the method for manufacturing a magnesium-based thermoelectric conversion element, the magnesium-based thermoelectric conversion material, the magnesium-based thermoelectric conversion element, and the thermoelectric conversion device according to embodiments of the present invention will be described with reference to drawings. The following embodiments specifically describe the present invention so as to promote understanding of the gist of the present invention, and unless otherwise specified, the present invention is not limited to the embodiments. Furthermore, in the drawings used in the following description, for convenience, main portions are enlarged in some cases so as to promote understanding of the characteristics of the present invention, and the dimensional ratio of each constituent is not the same as the actual one.

(Thermoelectric Conversion Material and Thermoelectric Conversion Element)

FIG. 1 is a cross-sectional view showing a magnesium-based thermoelectric conversion element in which a magnesium-based thermoelectric conversion material according to an embodiment of the present invention is used.

In the thermoelectric conversion element 10 shown in FIG. 1, electrodes 12a and 12b are formed on one surface 11a and the other surface 11b, facing the surface 11a, of a thermoelectric conversion material 11 respectively. Electrodes 13a and 13b are formed on the electrodes 12a and 12b respectively.

In the present embodiment, a thermoelectric conversion material, which is obtained by adding silicon oxide ($SiO_2$) and antimony (Sb) as a dopant to magnesium silicide ($Mg_2Si$) and sintering the mixture, is cut such that the thermoelectric conversion material 11 is processed to have a desired shape. In the thermoelectric conversion material 11 of the present embodiment, a magnesium-based sintered substance is used which is formed of $Mg_2Si$ containing $SiO_2$ at a concentration of 1.3 mol % and antimony at a concentration of 0.5 at %. In the present embodiment, by the addition of antimony, which is a pentavalent donor, the thermoelectric conversion material 11 becomes an n-type thermoelectric conversion material having high carrier density.

As the magnesium-based compound constituting the thermoelectric conversion material 11, in addition to $Mg_XSi_Y$ such as $Mg_2Si$, compounds obtained by adding other elements to $Mg_2Si$, such as $Mg_2Si_XGe_{1-X}$ and $Mg_2Si_XSn_{1-X}$, can also be used.

Furthermore, in addition to magnesium silicide, magnesium-tin (Mg—Sn), magnesium-germanium (Mg—Ge), and the like can also be used.

As a donor for making the thermoelectric conversion material 11 into an n-type thermoelectric conversion element, in addition to antimony, bismuth (Bi), aluminum (Al), phosphorus (P), arsenic (As), and the like can also be used.

In addition, the thermoelectric conversion material 11 may be made into a p-type thermoelectric conversion element. In this case, by adding a dopant such as lithium (Li) or silver (Ag) as an acceptor, the p-type thermoelectric conversion element is obtained.

Furthermore, Na, K, B, Ga, In, N, Cu, or Y may be incorporated as a dopant into the thermoelectric conversion material 11.

Figure 2:
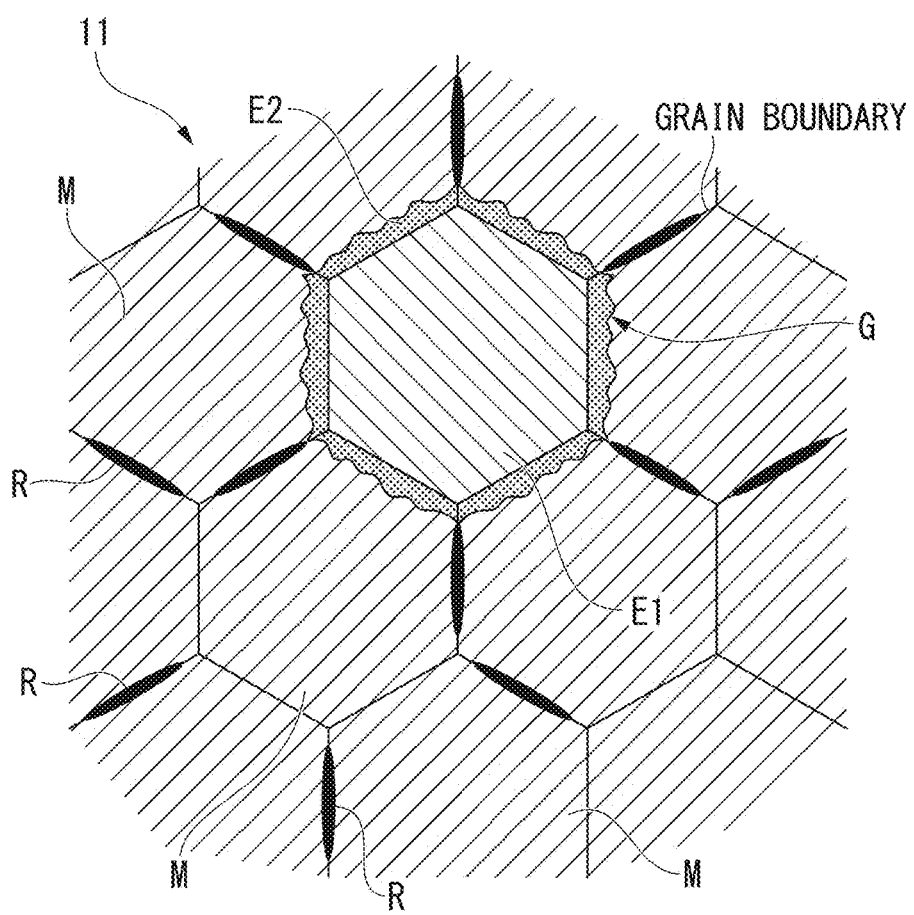
FIG. 2 is a schematic view based on an image obtained by observing a sintered substance constituting the thermoelectric conversion material by using an electron probe microanalyzer (EPMA).

The thermoelectric conversion material 11 of the present embodiment is obtained by sintering the magnesium-based compound and $SiO_2$. As shown in FIG. 2, a grain G of a reaction product generated at the time of sintering is constituted with a modified product E1 containing SiMgO and a high-concentration silicon region E2 formed on the periphery of the modified product E1. The modified product E1 contains magnesium (Mg) at a concentration within a range equal to or higher than 30 at % and equal to or lower than 50 at %, silicon (Si) at a concentration within a range equal to or higher than 0 at % and equal to or lower than 20 at %, and oxygen (O) at a concentration within a range equal to or higher than 40 at % and equal to or lower than 55 at %. The content of magnesium in the modified product E1 is preferably equal to or greater than 40 at % and equal to or smaller than 50 at % and more preferably equal to or greater than 45 at % and equal to or smaller than 50 at %, but the content is not limited thereto. The content of silicon in the modified product E1 is preferably equal to or greater than 0 at % and equal to or smaller than 15 at % and more preferably equal to or greater than 1 at % and equal to or smaller than 10 at %, but the content is not limited thereto. The content of oxygen in the modified product E1 is preferably equal to or greater than 42 at % and equal to or smaller than 50 at % and more preferably equal to or greater than 43 at % and equal to or smaller than 50 at %, but the content is not limited thereto.

The number density of the grains of the reaction product is within a range equal to or higher than 50 grains/mm$^2$ and equal to or lower than 700 grains/nm. The number density of the grains of the reaction product is preferably equal to or higher than 100 grains/mm$^2$ and equal to or lower than 500 grains/mm$^2$ and preferably equal to or higher than 130 grains/mm$^2$ and equal to or lower than 410 grains/mm$^2$, but the number density is not limited thereto.

The high-concentration silicon region E2 has a silicon concentration higher than that of the modified product E1.

In the related art, the sintered substance is obtained by performing sintering in a state where the substances (additives and grains) added to $Mg_2Si$ come into the space (void) between the grains of $Mg_2Si$ which is a matrix. At this time, due to solid-phase diffusion, the additives slightly permeate $Mg_2Si$ ($Mg_2Si$ grains). However, the additives do not deeply permeate $Mg_2Si$, and the amount of the additives is not large. In contrast, in a case where the sintered substance is obtained by adding $SiO_2$ to $Mg_2Si$ and sintering the mixture just like the thermoelectric conversion material 11 of the present embodiment, $SiO_2$ and Mg generated by the decomposition of $Mg_2Si$ causes an oxidation-reduction reaction. As a result, Mg permeates and is diffused in $SiO_2$, and hence SiMgO is formed. Furthermore, MgO is generated in $SiO_2$ in some cases. At this time, because $Mg_2Si$ has been decomposed, after Mg permeates and is diffused in $SiO_2$, Si remains. On the other hand, because Mg permeates and is diffused in $SiO_2$, surplus Si is generated by the amount of the permeating Mg. Consequently, Si is pushed out of $SiO_2$ and is diffused to the outside. It is considered that, accordingly, the grain G of the reaction product is formed which is constituted with the modified product E1 containing SiMgO (having the same size and shape as those of the silicon oxide added) and the high-concentration silicon region E2 formed on the periphery of the modified product E1.

Depending on the size of the modified product E1, a portion of added $SiO_2$ remains in the modified product E1 in some cases, or more MgO is present in the modified product E1 than SiMgO in some cases. Furthermore, due to the reaction between Mg and the oxygen of the oxidized layer on the surface of $Mg_2Si$ before sintering, MgO is formed on the grain boundary of $Mg_2Si$ in some cases.

Through this discovery of the aforementioned phenomenon, it is considered that in the $Mg_2Si$ grain, a region in which a portion of magnesium is substituted with silicon is formed in a range that is wider than a general diffusion range.

Furthermore, in the high-concentration silicon region in which a crystal grain boundary is formed between $Mg_2Si$ grains by the diffusion occurring in a wide range, the $Mg_2Si$ grains are connected to each other, and accordingly, the negative effect resulting from the crystal grain boundary such as the electric resistance resulting from the interface can be reduced.

The average grain size of the grains of the reaction product generated at the time of sintering the sintered substance constituting the thermoelectric conversion material 11 is equal to or greater than 0.5 μm and equal to or smaller than 100 μm. The average grain size of the grains of the reaction product is preferably equal to or greater than 1 μm and equal to or smaller than 70 μm and more preferably equal to or greater than 5 μm and equal to or smaller than 50 μm, but the average grain size is not limited thereto. In the sintered substance used in the present embodiment, the average grain size of the grains of the reaction product is within a range of 10 to 20 μm.

In the thermoelectric conversion material 11 of the present embodiment, as shown in FIG. 2, a Si-rich phase R having a Si concentration higher than that in a magnesium-based compound grain M is formed on the grain boundary of the magnesium-based compound grain M. It is preferable that the Si-rich phase R contain a trace of Sb and Al. Presumably, the Si-rich phase R may be formed by the decomposition of $SiO_2$ or the decomposition of magnesium-based compound.

In a case where the Si-rich phase R is formed on the grain boundary of the magnesium-based compound grain M, conductivity is secured. Particularly, in a case where the Si-rich phase R contains a trace of Sb and Al, conductivity is more reliably secured due to the effect of the dopant.

In the thermoelectric conversion material 11 of the present embodiment, a lattice constant difference obtained by subtracting a lattice constant of raw material powder formed of the magnesium-based compound from a lattice constant of the magnesium-based thermoelectric conversion material (lattice constant of magnesium-based thermoelectric conversion material–lattice constant of raw material powder formed of magnesium-based compound) is equal to or greater than 0.0005 angstrom (Å). That is, in the thermoelectric conversion material 11 of the present embodiment, by the addition of $SiO_2$ to the magnesium-based compound, the lattice constant changes, and the crystal phase is distorted.

In a case where the crystal phase is distorted in this way, free electrons easily move between the lattices, and hence the electric resistance can be further reduced. The upper limit of the lattice constant difference is preferably 0.003 angstrom (Å). The lattice constant difference is more preferably equal to or greater than 0.0007 angstrom (Å) and equal to or smaller than 0.002 angstrom (Å), but the lattice constant difference is not limited thereto.

In the thermoelectric conversion material 11 of the present embodiment, a proportion of the $Mg_2Si$ phase in the crystal phase except for an amorphous phase is equal to or higher than 75% by mass. That is, although MgO and Si are generated by the addition of $SiO_2$ to $Mg_2Si$, the proportion of the crystal phases of MgO and Si is relatively low, and the $Mg_2Si$ phase is secured. The proportion of the $Mg_2Si$ phase in the crystal phase except for an amorphous phase is preferably equal to or higher than 80% by mass and equal to or lower than 95% by mass, but the proportion is not limited thereto. The proportion of the MgO phase in the crystal phase except for an amorphous phase is preferably equal to or lower than 20% by mass and more preferably equal to or higher than 5% by mass and equal to or lower than 15% by mass, but the proportion is not limited thereto. The proportion of the Si phase in the crystal phase except for an amorphous phase is preferably equal to or higher than 1% by mass and more preferably equal to or higher than 1% by mass and equal to or lower than 5% by mass, but the proportion is not limited thereto.

FIG. 2 is a schematic view based on an image obtained by observing a thermoelectric conversion material by using an electron probe microanalyzer (EPMA). The sintered substance is obtained by, for example, heating a raw material for sintering, which is obtained by adding $SiO_2$ in an amount of 1.3 mol % to $Mg_2Si$, to a maximum temperature of 900° C. at a heating rate of 30° C./min under a pressure kept at 40 MPa in a vacuum atmosphere and holding the raw material for sintering at the same maximum temperature for 30 seconds.

As the original shape of the thermoelectric conversion material 11 before molding (shape after sintering), various shapes such as a square plate shape, a circular plate shape, a cubic shape, a rectangular shape, and a cylindrical shape can be adopted. For a thermoelectric element (thermoelectric conversion element 10) of the present embodiment, a rectangular element piece is formed by being taken out of the central region of an ingot of the sintered substance formed as a cylindrical substance, and the element piece is used as the thermoelectric conversion material 11.

As the electrodes 12a and 12b, nickel, silver, cobalt, tungsten, molybdenum, and the like are used. In the present embodiment, nickel is used as the electrodes 12a and 12b. The electrodes 12a and 12b can be formed by energizing sintering, plating, electrodeposition, and the like.

The electrodes 13a and 13b are formed of a metal material having excellent conductivity, for example, a plate material such as copper or aluminum. In the present embodiment, a rolled aluminum plate is used. The thermoelectric conversion material 11 (electrodes 12a and 12b) and the electrodes 13a and 13b can be joined to each other by Ag brazing, Ag plating, and the like.

For example, the thermoelectric conversion element 10 constituted as above can be used as a Seebeck element in which a temperature difference is caused between one surface 11a and the other surface 11b of the thermoelectric conversion material 11 such that a potential difference is caused between the electrode 13a and the electrode 13b. For instance, by allowing the electrode 13a side to be in a high-temperature state and the electrode 13b side to be in a low-temperature state (for example, room temperature), electric power can be taken out from between the electrode 13a and the electrode 13b.

Furthermore, for example, the thermoelectric conversion element 10 can be used as a Peltier element in which voltage is applied between the electrode 13a side and the electrode 13b such that a temperature difference is caused between one surface 11a and the other surface 11b of the thermoelectric conversion material 11. For instance, by allowing an electric current to flow between the electrode 13a side and the electrode 13b, one surface 11a and the other surface 11b of the thermoelectric conversion material 11 can be cooled or heated.

According to the thermoelectric conversion material 11 constituted as above and the thermoelectric conversion element 10 in which the thermoelectric conversion material 11 is used, by adding silicon oxide ($SiO_2$) to magnesium silicide ($Mg_2Si$) and sintering the mixture, the grain G of the reaction product, which is constituted with the modified product E1 containing SiMgO and having a magnesium concentration within a range of 30 to 50 at %, a silicon concentration within a range of 0 to 20 at %, and an oxygen concentration within a range of 40 to 55 at % and the high-concentration silicon region E2 formed on the periphery of the modified product E1, is formed as the thermoelectric conversion material 11. Therefore, the thermoelectric conversion material 11 or the thermoelectric conversion element 10 having improved thermoelectric conversion efficiency and excellent mechanical strength can be realized.

By improving the thermoelectric conversion efficiency of the thermoelectric conversion material 11 or the thermoelectric conversion element 10, exhaust heat or the like can be converted into electric power with high efficiency. Furthermore, a compact cooler having excellent cooling efficiency can be realized. In addition, for example, just like an on-vehicle device and the like, the thermoelectric conversion material 11 having excellent mechanical strength can be used as a thermoelectric conversion element for a thermal power generation device or a cooling device even in an environment in which vibration occurs.

(Thermoelectric Conversion Device: First Embodiment)

Figure 3:
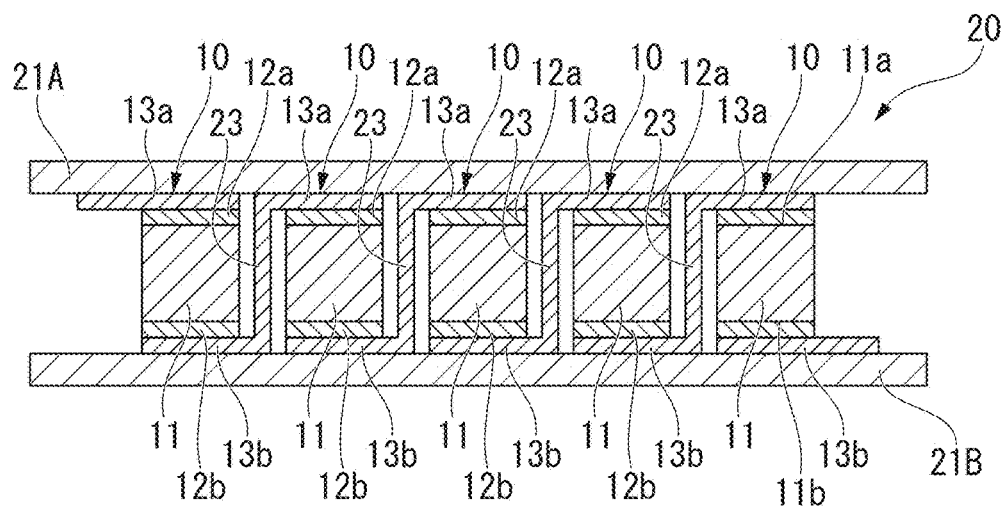
FIG. 3 is a cross-sectional view showing a thermoelectric conversion device of a first embodiment.

FIG. 3 is a cross-sectional view showing a thermoelectric conversion device of a first embodiment.

The thermoelectric conversion device 20 is a unileg-type thermoelectric conversion device.

The thermoelectric conversion device 20 is constituted with a plurality of thermoelectric conversion elements 10, 10, . . . arranged on the same plane and heat transfer plates 21A and 21B disposed on one side and the other side of the arranged thermoelectric conversion element 10, 10, . . . respectively.

The thermoelectric conversion elements 10, 10, . . . are formed of the same type of semiconductor, that is, an n-type thermoelectric conversion element doped with a donor such as antimony or a p-type thermoelectric conversion element doped with a dopant such as lithium or silver. In the present embodiment, the thermoelectric conversion elements 10, 10, . . . are n-type thermoelectric conversion elements doped with antimony as a donor.

Each of the thermoelectric conversion elements 10 is constituted with the thermoelectric conversion material 11, the electrodes 12a and 12b which come into contact with one surface 11a and the other surface 11b of the thermoelectric conversion material 11 respectively and are formed of nickel, and the electrodes 13a and 13b formed in a state of being superposed on the electrodes 12a and 12b. Between the thermoelectric conversion elements 10 and 10 adjacent to each other, the electrode 13a of one thermoelectric conversion element 10 is electrically connected to the electrode 13b of the other thermoelectric conversion element 10 through a connection terminal 23. In reality, the electrode 13a, the connection terminal 23, and the electrode 13b of the thermoelectric conversion elements 10 and 10 adjacent to each other are formed as an integrated electrode plate.

A large number of thermoelectric conversion elements 10, 10, . . . arranged as above are connected to each other in series such that they are electrically connected to each other. For convenience, FIG. 3 shows only one line of thermoelectric conversion elements 10, 10, . . . so as to clearly describe the elements. However, in reality, a large number of thermoelectric conversion elements 10, 10, . . . are also arranged in the depth direction of the page showing FIG. 3.

The heat transfer plates 21A and 21B are media which apply heat to one surface 11a or the other surface 11b of the thermoelectric conversion material 11 or cause one surface 11a or the other surface 11b of the thermoelectric conversion material 11 to absorb heat. As the heat transfer plates 21A and 21B, it is possible to use an insulating material having excellent thermal conductivity, for example, a plate material such as silicon carbide, silicon nitride, aluminum nitride, or aluminum oxide.

Furthermore, a conductive metal material can be used as the heat transfer plates 21A and 21B, and an insulating layer or the like can be formed between the heat transfer plates 21A and 21B and the electrodes 12a and 12b. Examples of the insulating layer include a resin film or plate, a ceramic thin film or plate, and the like.

In the thermoelectric conversion device 20 of the present embodiment, as the thermoelectric conversion material 11 constituting each of the thermoelectric conversion elements 10, a sintered substance obtained by adding silicon oxide ($SiO_2$) to magnesium silicide ($Mg_2Si$) and sintering the mixture is used, in which the grains G of the reaction product, which is constituted with the modified product E1 containing SiMgO and having a magnesium concentration within a range of 30 to 50 at %, a silicon concentration within a range of 0 to 20 at %, and an oxygen concentration within a range of 40 to 55 at % and the high-concentration silicon region E2 formed on the periphery of the modified product E1, are dispersed in $Mg_2Si$. Accordingly, the thermoelectric conversion efficiency of the thermoelectric conversion device 20 is improved.

The unileg-type thermoelectric conversion device 20 constituted as above can be used as, for example, a Seebeck thermal power generation device in which heat is applied to any one of the heat transfer plate 21A and the heat transfer plate 21B so as to take out electric power from between the electrode 13a and the electrode 13b of the thermoelectric conversion elements 10 at both ends among the thermoelectric conversion elements 10, 10, . . . connected to each other in series. For instance, in a case where the unileg-type thermoelectric conversion device 20 is provided in a flow path of an exhaust gas from an automobile engine such that one heat transfer plate 21A absorbs the heat of the exhaust gas, the temperature of the exhaust gas can be reduced, and the electric power generated by the exhaust gas can be reused as control system electric power or as a power source for a sensor of the automobile.

Furthermore, the unileg-type thermoelectric conversion device 20 can be used as, for example, a Peltier cooling device in which voltage is applied between the electrode 13a and the electrode 13b of the thermoelectric conversion elements 10 at both ends among the thermoelectric conversion elements 10, 10, . . . connected to each other in series so as to cool any one of the heat transfer plate 21A and the heat transfer plate 21B. For instance, in a case where the unileg-type thermoelectric conversion device 20 is joined to a heatsink of a CPU or a semiconductor laser, it is possible to efficiently cool the CPU while saving space or to control the temperature of the semiconductor laser.

In the unileg-type thermoelectric conversion device 20, all of the thermoelectric conversion materials 11 constituting the thermoelectric conversion elements 10 are of the same type of semiconductor. Accordingly, the manufacturing cost of the thermoelectric conversion device 20 is low, and it is easy to manufacture the thermoelectric conversion device 20. Furthermore, because the thermoelectric conversion materials 11 have the same coefficient of thermal expansion, problems such as cracking of the elements caused by thermal stress or electrode peeling do not occur.

(Thermoelectric Conversion Device: Second Embodiment)

Figure 4:
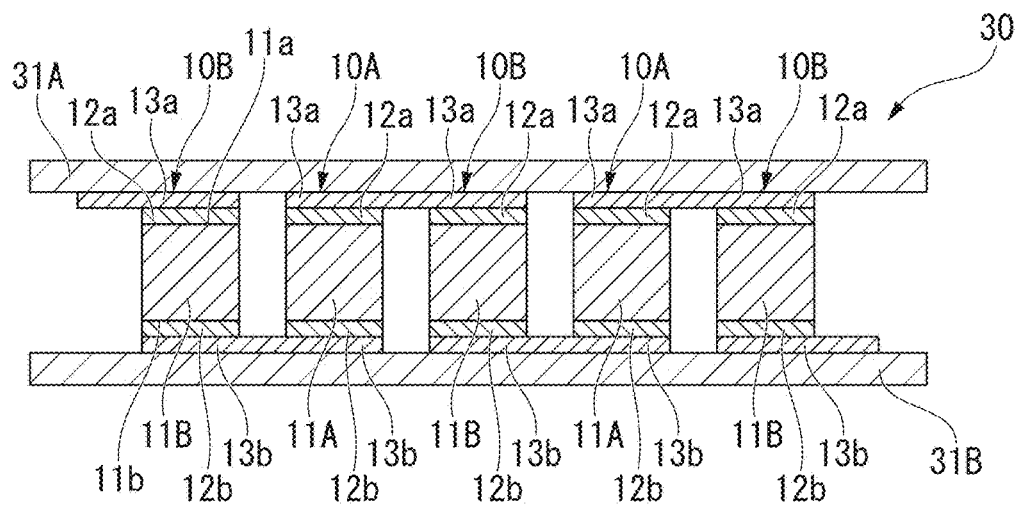
FIG. 4 is a cross-sectional view showing a thermoelectric conversion device of a second embodiment.

FIG. 4 is a cross-sectional view showing a thermoelectric conversion device of a second embodiment.

A thermoelectric conversion device 30 is a π (pi)-type thermoelectric conversion device.

The thermoelectric conversion device 30 is constituted with thermoelectric conversion elements 10A and 10B which are alternately arranged on the same plane and heat transfer plates 31A and 31B which are disposed one side and the other side of the arranged thermoelectric conversion elements 10A and 10B respectively.

The thermoelectric conversion element 10A is an n-type thermoelectric conversion element having a thermoelectric conversion material 11A doped with a donor such as antimony. The thermoelectric conversion element 10B is a p-type thermoelectric conversion element having a thermoelectric conversion material 11B doped with a dopant such as lithium or silver. Alternatively, the thermoelectric conversion element 10B is a MnSi-based P-type thermoelectric element such as $MnSi_{1.73}$.

Each of the thermoelectric conversion elements 10A and 10B is constituted with the thermoelectric conversion materials 11A and 11B, the electrodes 12a and 12b which are connected to one surface 11a and the other surface 11b of the thermoelectric conversion materials 11A and 11B respectively and are formed of nickel, and the electrodes 13a and 13b which are formed in a state of being superposed on the electrodes 12a and 12b. Between the thermoelectric conversion elements 10A and 10B adjacent to each other, the electrode 13a of the thermoelectric conversion element 10 OA is electrically connected to the electrode 13a of the thermoelectric conversion element 10B, and the electrode 13b of the thermoelectric conversion element 10B is connected to the electrode 13b of another neighboring thermoelectric conversion element 10A opposite to the aforementioned thermoelectric conversion element 10A.

In reality, in the adjacent thermoelectric conversion elements 10A and 10B, the electrode 13a of the thermoelectric conversion element 10A and the electrode 13a of the thermoelectric conversion element 10B, or the electrodes 13b adjacent to the electrodes 13a are formed as an integrated electrode plate. As the electrode plates, for example, a copper plate or an aluminum plate can be used.

A large number of thermoelectric conversion elements 10A and 10B arranged as above are connected to each other in series such that they are electrically connected to each other. That is, in the $\pi$ (pi)-type thermoelectric conversion device 30, n-type thermoelectric conversion elements 10A and p-type thermoelectric conversion elements 10B repeatedly alternate with each other and are connected to each other in series.

For convenience, FIG. 4 shows only one line of thermoelectric conversion elements 10A and 10B so as to clearly describe the elements. However, in reality, a large number of thermoelectric conversion elements 10A and 10B are also arranged in the depth direction of the page showing FIG. 4.

The heat transfer plates 31A and 31B are media which apply heat to one surface 11a or the other surface 11b of the thermoelectric conversion materials 11A and 11B or which cause one surface 11a and the other surface 11b of the thermoelectric conversion materials 11A and 11B to absorb heat. As the heat transfer plates 31A and 31B, an insulating material having excellent thermal conductivity, for example, a plate material such as silicon carbide, silicon nitride, aluminum nitride, or aluminum oxide can be used.

Furthermore, a conductive metal material can be used as the heat transfer plates 31A and 31B, and an insulating layer or the like can be formed between the heat transfer plates 31A and 31B and the electrodes 13a and 13b. Examples of the insulating layer include a resin film or plate, a ceramic thin film or plate, and the like.

In the thermoelectric conversion device 30 of the present embodiment, as the thermoelectric conversion materials 11A and 11B constituting the thermoelectric conversion elements 10A and 10B respectively, a sintered substance obtained by adding silicon oxide ($SiO_2$) to magnesium silicide ($Mg_2Si$) and sintering the mixture is used, in which the grains G of the reaction product, which is constituted with the modified product E1 containing SiMgO and having a magnesium concentration within a range of 30 to 50 at %, a silicon concentration within a range of 0 to 20 at %, and an oxygen concentration within a range of 40 to 55 at % and the high-concentration silicon region E2 formed on the periphery of the modified product E1, are dispersed in $Mg_2Si$. Accordingly, the thermoelectric conversion efficiency of the thermoelectric conversion device 30 is improved.

The $\pi$ (pi)-type thermoelectric conversion device 30 constituted as above can be used as, for example, a Seebeck thermal power generation device in which heat is applied to any one of the heat transfer plate 31A and the heat transfer plate 31B so as to take out electric power from between the electrode 13a and the electrode 13b of the thermoelectric conversion elements 10A and 10B at both ends among the alternating thermoelectric conversion elements 10A and 10B connected to each other in series. For instance, in a case where the $\pi$ (pi)-type thermoelectric conversion device 30 is provided in a flow path of an exhaust gas from an automobile engine such that one heat transfer plate 31A absorbs the heat of the exhaust gas, the temperature of the exhaust gas can be reduced, and the electric power generated by the exhaust gas can be reused as control system electric power of the automobile.

Furthermore, the $\pi$ (pi)-type thermoelectric conversion device 30 can be used as, for example, a Peltier cooling device in which voltage is applied between the electrode 13a and the electrode 13b of the thermoelectric conversion elements 10A and 10B at both ends among the thermoelectric conversion elements 10A and 10B connected to each other in series so as to cool any one of the heat transfer plate 31A and the heat transfer plate 31B. For instance, in a case where the $\pi$ (pi)-type thermoelectric conversion device 30 is joined to a heatsink of a CPU or a semiconductor laser, it is possible to efficiently cool the CPU while saving space or to control the temperature of the semiconductor laser.

(Method for Manufacturing Thermoelectric Conversion Material and Method for Manufacturing Thermoelectric Conversion Element)

The method for manufacturing a thermoelectric conversion material and the method for manufacturing a thermoelectric conversion element according to an embodiment of the present invention will be described.

Figure 5:
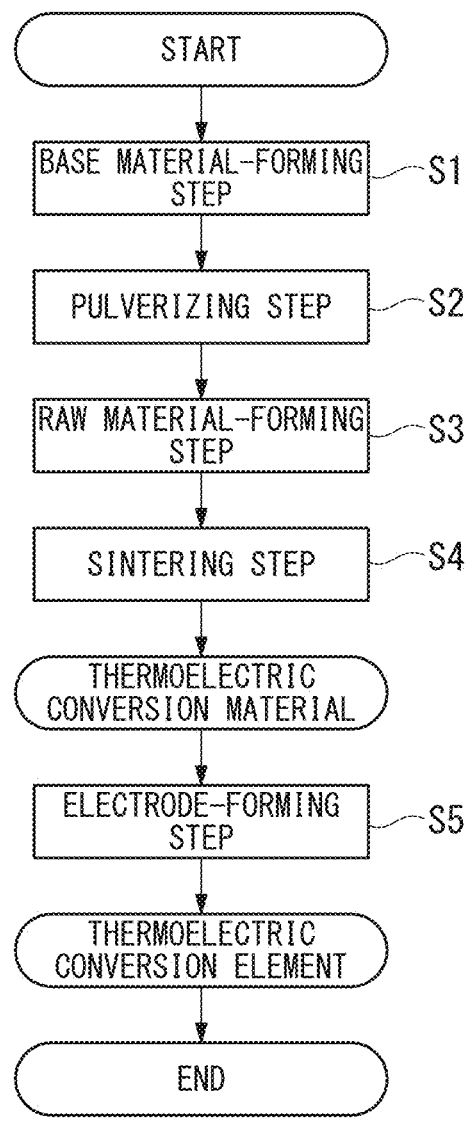
FIG. 5 is a flowchart showing a method for manufacturing a thermoelectric conversion material and a method for manufacturing a thermoelectric conversion element of an embodiment of the present invention in stages.

FIG. 5 is a flowchart showing the method for manufacturing a thermoelectric conversion material and the method for manufacturing a thermoelectric conversion element of an embodiment of the present invention in stages.

For manufacturing the thermoelectric conversion material of the present embodiment, first, a magnesium-based compound that becomes a base material (matrix) of a sintered substance as a thermoelectric conversion material is manufactured (base material-forming step S1).

In the present embodiment, magnesium silicide ($Mg_2Si$) is used as the magnesium-based compound. Therefore, for example, magnesium powder, silicon powder, and a dopant are measured respectively and mixed together. For instance, in a case where an n-type thermoelectric conversion material is formed, a pentavalent material such as antimony or bismuth or aluminum is mixed as a dopant, and in a case where a p-type thermoelectric conversion material is formed, a material such as lithium or silver is mixed as a dopant. In the present embodiment, in order to obtain an n-type thermoelectric conversion material, antimony is used as a dopant, and the amount thereof added is set to be 0.5 at %. The amount of antimony added is a ratio of the amount of the added antimony to a $Mg_2Si$ solid obtained after solidification. The mixed powder is put into, for example, an alumina crucible and heated at a temperature of about 800° C. to 1150° C. In this way, a $Mg_2Si$ solid in the form of, for example, a lump is obtained. At the time of heating, a small amount of magnesium is sublimated. Therefore, at the time of measuring the raw materials, it is preferable to add, for example, about 5% more magnesium for the stoichiometric composition of Mg:Si=2:1.

Then, the obtained $Mg_2Si$ in the form of a solid is pulverized by a pulverizer such that the grain size thereof becomes 10 μm to 75 μm, thereby forming $Mg_2Si$ in the form of fine powder (pulverizing step S2). The grain size of the magnesium-based compound ($Mg_2Si$ in the present embodiment) is preferably 10 µm to 70 µm and more preferably 10 µm to 50 µm, but the grain size is not limited thereto.

Thereafter, the obtained $Mg_2Si$ is uniformly mixed with silicon oxide, thereby forming a raw material for sintering (raw material-forming step S3). As the silicon oxide, it is possible to use $SiO_x$ (x=1 to 2) such as amorphous $SiO_2$, cristobalite, quartz, tridymite, coesite, stishovite, seifertite, or shocked quartz. The mixing amount of the silicon oxide is within a range equal to or greater than 0.5 mol % and equal to or smaller than 13.0 mol %. The mixing amount is a ratio of the amount of the silicon oxide to the amount of the magnesium-based compound ($Mg_2Si$ in the present embodiment) to be mixed. The mixing amount of the silicon oxide is more preferably equal to or greater than 0.7 mol % and equal to or smaller than 7 mol %, but the mixing amount is not limited thereto. The silicon oxide may be in the form of powder having a grain size of 0.5 µm to 100 µm. The grain size of the silicon oxide is more preferably 1 µm to 50 µm, but the grain size is not limited thereto. In the present embodiment, as the silicon oxide, $SiO_2$ powder having a median grain size of 20 µm is added.

In a case where commercial $Mg_2Si$ powder or $Mg_2Si$ powder to which a dopant is added is used, the steps (the base material-forming step S1 and the pulverizing step S2) performed until the aforementioned $Mg_2Si$ powder is formed can be omitted.

The raw material powder (raw material for sintering) formed of the $Mg_2Si$ powder and the $SiO_2$ powder obtained as above is sintered by heating (sintering step S4). For sintering the raw material powder, for example, an energizing sintering apparatus is used.

Figure 6:
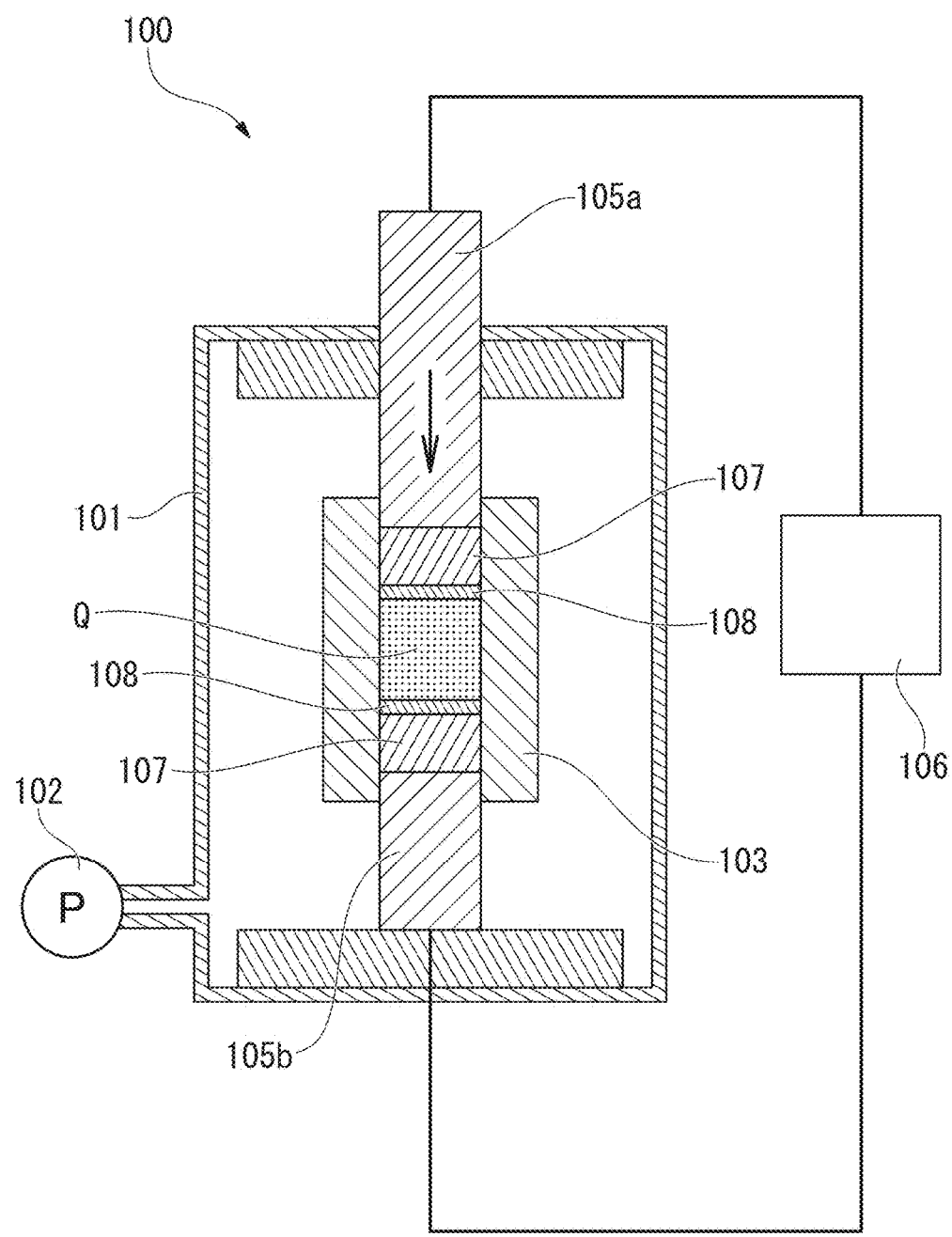
FIG. 6 is a cross-sectional view showing an example of a discharge plasma sintering device.

FIG. 6 is a cross-sectional view showing an example of the energizing sintering apparatus. The energizing sintering apparatus 100 includes, for example, a pressure-resistant housing 101, a vacuum pump 102 which reduces the internal pressure of the pressure-resistant housing 101, a carbon mold 103 which is disposed in the pressure-resistant housing 101 and in the form of a hollow cylinder, a pair of electrodes 105a and 105b which applies an electric current while applying pressure to raw material powder Q with which the carbon mold 103 is filled, and a power source device 106 which applies voltage between the pair of electrodes 105a and 105b. Between the electrodes 105a and 105b and the raw material powder Q, a carbon plate 107 and a carbon sheet 108 are provided respectively. The energizing sintering apparatus 100 also includes, in addition to these, a thermometer, a displacement meter, and the like not shown in the drawing.

The carbon mold 103 of the energizing sintering apparatus 100 constituted as above is filled with the raw material powder Q obtained in the raw material-forming step S3. The inside of the carbon mold 103 is covered with, for example, a graphite sheet or a carbon sheet. By using the power source device 106, a direct current is allowed to flow between the pair of electrodes 105a and 105b such that the raw material powder Q is heated by self-heating caused by the flow of electric current in the powder. Furthermore, between the pair of electrodes 105a and 105b, the electrode 105a on the movable side is moved toward the raw material powder Q (in the direction of the arrow in FIG. 6), and a predetermined pressure is applied to the raw material powder Q between the electrode 105a and the electrode 105b on the fixed side. In this way, by using the self-heating caused by the electric current directly applied to the sample and the application of pressure as a driving force for sintering, energizing sintering is performed on the raw material powder.

As the sintering conditions, the applied pressure is set to be equal to or higher than 10 MPa and equal to or lower than 70 MPa, and the maximum temperature at the time of heating is set to be equal to or higher than 750° C. and equal to or lower than 950° C. The applied pressure is preferably equal to or higher than 15 MPa and equal to or lower than 50 MPa and more preferably equal to or higher than 20 MPa and equal to or lower than 40 MPa, but the applied pressure is not limited thereto. The maximum temperature at the time of heating is preferably equal to or higher than 800° C. and equal to or lower than 950° C. and more preferably equal to or higher than 850° C. and equal to or lower than 950° C., but the maximum temperature is not limited thereto.

The holding time at the maximum temperature may be equal to or longer than 0 seconds and equal to or shorter than 10 minutes, and the cooling rate may be equal to or higher than 10° C./min and equal to or lower than 50° C./min. The holding time is preferably equal to or longer than 0 seconds and equal to or shorter than 5 minutes and more preferably equal to or longer than 0 seconds and equal to or shorter than 3 minutes, but the holding time is not limited thereto. The cooling rate is preferably equal to or higher than 20° C./min and equal to or lower than 50° C., but the cooling rate is not limited thereto.

The heating rate may be equal to or higher than 10° C./min and equal to or lower than 100° C./min. In a case where the heating rate is equal to or higher than 10° C./min and equal to or lower than 100° C./min, the raw material can be sintered within a relatively short period of time, and the reaction between the residual oxygen and the high-concentration silicon region E2, which will be described later, can be inhibited, and hence the oxidation of the high-concentration silicon region E2 can be inhibited. The heating rate is preferably equal to or higher than 20° C./min and equal to or lower than 70° C./min and more preferably equal to or higher than 25° C./min and equal to or lower than 50° C./min, but the heating rate is not limited thereto. The internal atmosphere of the pressure-resistant housing 101 may be an inert atmosphere such as an argon atmosphere or a vacuum atmosphere. In a case where the vacuum atmosphere is adopted, the pressure may be equal to or lower than 5 Pa.

The thermoelectric conversion material, which is a sintered material (sintered substance) obtained after sintering, is in the form of a cylinder having a diameter of 30 mm and a thickness of 10 mm.

In a case where sintering is performed by adding the $SiO_2$ powder to the $Mg_2Si$ powder to which antimony powder is added as a dopant, Mg generated by the decomposition of $SiO_2$ and $Mg_2Si$ causes an oxidation-reduction reaction. As a result, Mg permeates and is diffused in $SiO_2$, and hence SiMgO is formed. In some cases, MgO is generated in a portion of $SiO_2$. Because Mg permeates and is diffused in $SiO_2$, surplus Si is generated by the amount of the permeating Mg. Therefore, Si is pushed out of $SiO_2$ and diffused to the outside. Consequently, it is possible to manufacture a thermoelectric conversion material in which grains G of a reaction product, which is constituted with the modified product E1 (having the same size and shape as those of $SiO_2$ added) containing SiMgO and the high-concentration silicon region E2 formed on the periphery of the modified product E1, are formed.

Depending on the size of the aforementioned modified product E1, a portion of the added $SiO_2$ remains in the modified product E1 in some cases, or more MgO is present in the modified product E1 than SiMgO in some cases. Furthermore, due to the reaction between Mg and oxygen of the oxidized layer on the surface of $Mg_2Si$ before sintering, MgO is formed on the grain boundary of $Mg_2Si$ in some cases.

The high-concentration silicon region E2, which contains a dopant (antimony in the present embodiment), in $Mg_2Si$ crosses the crystal grain boundary of $Mg_2Si$. Therefore, the electric resistance of the crystal grain boundary is reduced, and hence the electric resistance of the magnesium-based thermoelectric conversion material is reduced.

Generally, at the time of forming the base material of $Mg_2Si$ (S1 in the present embodiment), an excess of MG is added so as to reduce the loss of Mg from the stoichiometric composition caused by the evaporation of Mg. Therefore, the proportion of Mg is higher than that in the stoichiometric composition of $Mg_2Si$. Due to the excess of Mg, while the thermoelectric conversion material is being used as a thermoelectric conversion element, MgO is formed by the diffusion of oxygen from the outside of the element. MgO formed in this way results in the distortion of the crystal obtained after sintering, and accordingly, the crystal of the element becomes brittle, and embrittlement is caused. However, in the present embodiment, because $SiO_2$ absorbs the excess of Mg at the time of forming the sintered substance (thermoelectric conversion material), the excess of Mg does not remain after the element is formed. Consequently, in a case where the thermoelectric conversion device, in which the thermoelectric conversion material of the present embodiment is used, is used, it is possible to prevent the deterioration of the thermoelectric conversion element that is caused by oxidation while the element is being used.

Then, the thermoelectric conversion material is cut in a predetermined element size, and the electrodes 12a and 12b are joined to one surface and the other surface respectively. In this way, the thermoelectric conversion element 10 (see FIG. 1) according to an embodiment of the present invention is obtained (electrode-forming step S5).

In the present embodiment, an energizing sintering method is used for sintering the raw material powder. However, in addition to this, it is possible to use various pressurizing and heating methods such as a hot pressing method, a hot isostatic pressing method, a discharge plasma sintering method, a hot rolling method, a hot extrusion method, and a hot forging method.

Hitherto, several embodiments of the present invention have been described, but these embodiments are merely examples and do not limit the scope of the present invention. These embodiments can be embodied in various other forms, and within a range that does not depart from the gist of the present invention, but omission, substitution, and modification can be performed in various ways. These embodiments or the modifications thereof are included in the inventions described in Claims and the scope equivalent to the inventions just as the embodiments or the modifications thereof are included in the scope or the gist of the invention.

EXAMPLES

Hereinafter, examples of the present invention will be described.

As examples and comparative examples, 10.5 g of Mg (grain size: 180 μm, manufactured by Kojundo Chemical Lab. Co., Ltd.) having purity of 99.9%, 5.75 g of Si (grain size: 300 μm, manufactured by Kojundo Chemical Lab. Co., Ltd.) having purity of 99.99%, and 0.374 g of Sb (grain size: 300 μm, manufactured by Kojundo Chemical Lab. Co., Ltd.) having purity of 99.9% were measured. These powders were thoroughly mixed together in a mortar, and the mixture was put into an alumina crucible and heated for 2 hours at 850° C. in Ar-5% $H_2$. Considering the loss of Mg from the stoichiometric composition of Mg:Si=2:1 that is caused by the sublimation of Mg, 5% more Mg was mixed in. In this way, a $Mg_2Si$ solid (base material) was obtained.

Then, the $Mg_2Si$ solid (base material) was finely ground in a mortar, and the powder was classified, thereby preparing Sb-doped $Mg_2Si$ powder having a grain size equal to or smaller than 75 μm. The Sb-doped $Mg_2Si$ powder was thoroughly mixed with $SiO_2$ (grain size: 20 μm, manufactured by TATSUMORI LTD.) by being added in the amount described in Table 1 by using a mortar, thereby obtaining raw material powder (raw material for sintering) of each of the examples and the comparative examples. In Table 1, the amount of $SiO_2$ added is described as a ratio (mol %) of the amount of $SiO_2$ to the amount of the $Mg_2Si$ powder mixed.

A carbon mold including a carbon sheet covering the inside thereof was filled with the raw material powder and set in an energizing sintering apparatus, and by performing energizing sintering, a sintered substance of a magnesium silicide-based thermoelectric conversion material was prepared. The applied pressure and the maximum temperature were as described in Table 1, and the raw material powder was sintered in a vacuum atmosphere (1 Pa) under the conditions of a heating rate of 30° C./min and a holding time at the maximum temperature of 60 seconds. Each of the obtained samples was in the form of a 30 mm (diameter)×10 mm (thickness) cylinder.

For each of the samples obtained as above, the composition of the modified product of the grains of the reaction product, the number density of the grains of the reaction product, the Seebeck coefficient, the electric conductivity, the power factor, and the Vickers hardness (HV) were measured. In addition, the difference in a lattice constant of the sample and a lattice constant (6.354800 angstrom) of the raw material powder ($Mg_2Si$) was measured. Furthermore, the proportion (% by mass) of each of the $Mg_2Si$ phase, the MgO phase, and the Si phase was calculated, and the samples were observed using EPMA. A thermoelectric element was cut off from the cylindrical sample, and the central portion of the long surface of the thermoelectric element was adopted as a surface observed by EPMA.

Figure 7:
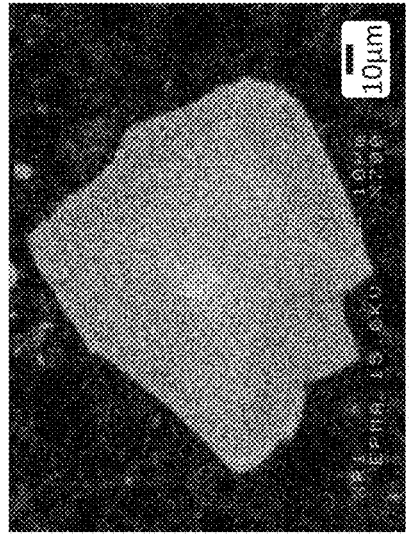
FIG. 7 shows EPMA observation images in an example.
Figure 7:
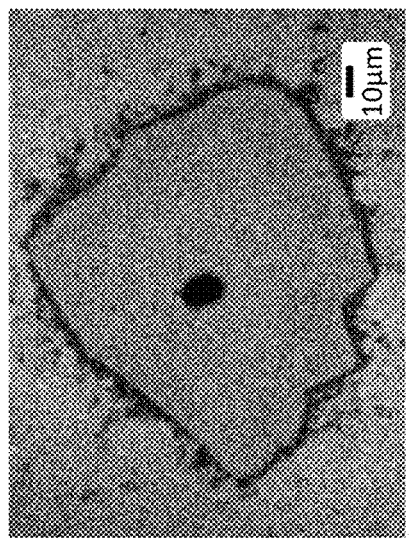
Figure 7:
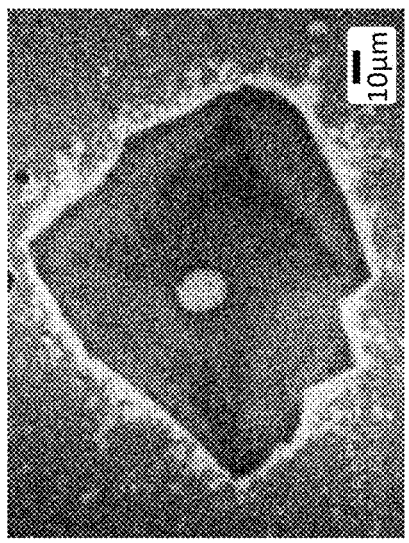

FIG. 7 (Example 2) shows examples of images observed using EPMA (AXA-8800RL manufactured by JEOL Ltd).

From these images, the grains of the reaction product are observed. FIG. 7 shows the grains of the reaction product observed at 700× magnification. In FIG. 7, (a) is a compositional image of magnesium, (b) is a compositional image of oxygen, and (c) is a compositional image of silicon. According to the concentration distribution images (compositional images) of magnesium, oxygen, and silicon shown in FIG. 7, the presence of magnesium substituted with silicon is observed on the inside of the modified product that is approximately in the form of a rhombus, and a high-concentration region of silicon (high-concentration silicon region E2) diffused to the outside is observed in the outer peripheral portion of the modified product. It is understood that in the central portion of the grain of the reaction product, unreacted $SiO_2$ remains in the form of a small sphere.

Figure 8:
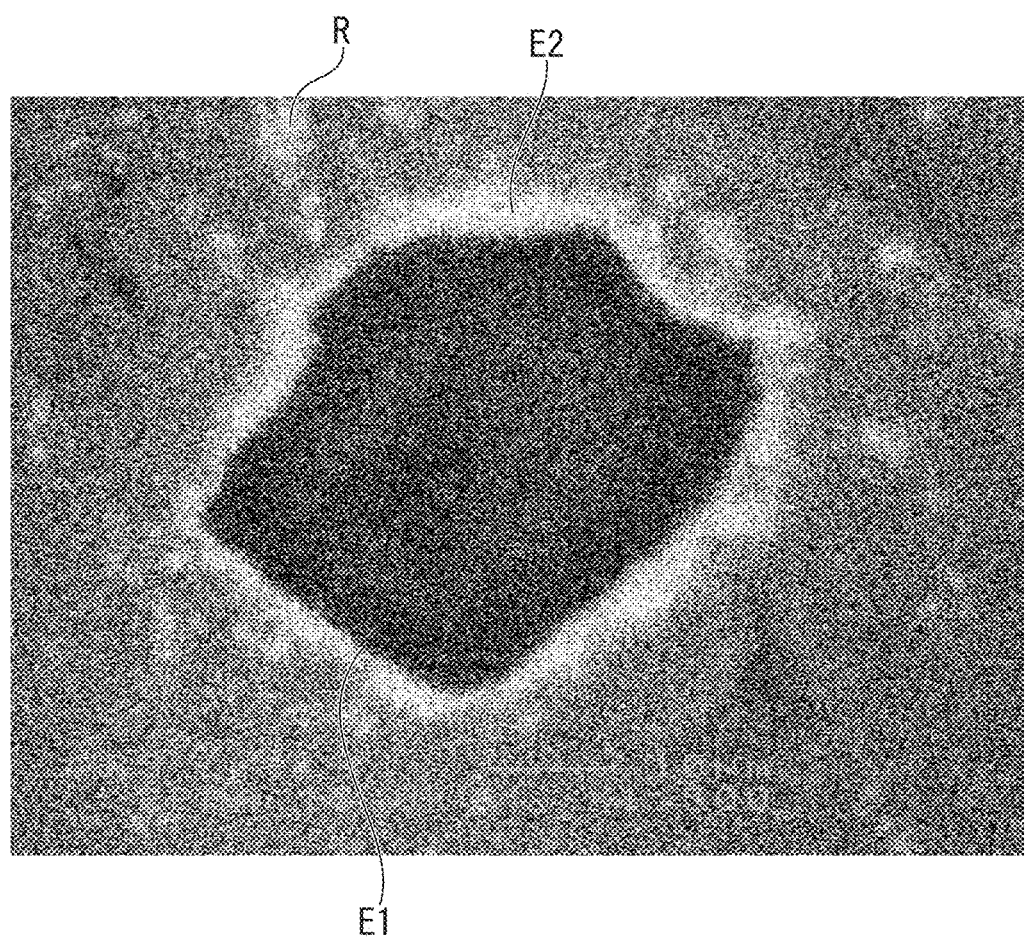
FIG. 8 is a Si mapping image in an example.

FIG. 8 is an observation image obtained by performing Si mapping on Example 2. The high-concentration silicon region E2 diffused to the outside is observed in the outer peripheral portion of the modified product E1. Furthermore, it was confirmed that the Si-rich phase R having a high Si concentration is on the outside of the high-concentration silicon region E2.

The composition of the modified product of the grains of the reaction product was measured by performing quantitative analysis on the modified product by using EPMA. The measurement was performed at three sites, and the average was calculated. Specifically, point analysis was performed for any three sites in one modified product, thereby obtaining the composition of each of the measurement sites. Then, the average of the three sites measured was taken as the composition of the modified product of the grains of the reaction product.

From the observation image (magnification: 100×, 8,500 μm×11,500 μm) obtained using EPMA (AXA-8800RL manufactured by JEOL Ltd.), the number of grains of the reaction product was determined, and the number was divided by the measurement area (area of the observed region), thereby obtaining the number density of the grains of the reaction product. The number density was measured at 10 sites, and the average was taken as the number density of the grains of the reaction product.

The Seebeck coefficient and the electric conductivity were measured using ZEM-3 manufactured by ADVANCE RIKO, Inc. The measurement was performed twice at 550° C., and the average was calculated. Specifically, a high-temperature side was set to be 550° C. while a low-temperature side was set to be 510° C., 520° C., and 530° C. such that a temperature difference of 20° C., 30° C., and 40° C. was caused between the measurement points in the sample. In this way, an electromotive force caused by each temperature difference was determined, a linear approximation of the graph of the temperature difference and the electromotive force was determined, and the slope of the linear approximation was taken as the Seebeck coefficient.

The power factor at 550° C. was calculated from the following Equation (1).

$$PF = S^2 \sigma \qquad (1)$$

S represents the Seebeck coefficient (V/K), and σ represents the electric conductivity (S/m))

The Vickers hardness (HV) was measured using a Vickers hardness tester HV-114 (manufactured by Mitutoyo Corporation). The measurement was performed five times, and the average was calculated. Specifically, a cross section of the sample taken along the thickness direction of the sample was adopted as a measurement surface, the Vickers hardness was measured at any five sites on the measurement surface, and the average was taken as HV.

The lattice constant and the proportion (% by mass) of each of the $Mg_2Si$ phase, the MgO phase, and the Si phase were measured by a powder X-ray diffraction method. The measurement was performed using DSADVANCE manufactured by Bruker AXS and using Cu as a target and by setting a tube voltage to be 40 kV, a tube current to be 40 mA, a scan range to be 20° to 140°, and a step width to be 0.01°.

By using analysis software of TOPAS (Version 5) manufactured by Bruker AXS, the lattice constant and the proportion (% by mass) of each of the $Mg_2Si$ phase, the MgO phase, and the Si phase were obtained from the measurement results by the Rietveld method.

The measurement results are shown in Tables 1 and 2. For the items that could not be measured, "-" is marked in the tables.

TABLE 1

| | Amount of $SiO_2$ added (mol %) | Applied pressure (MPa) | Maximum temperature (° C.) | Composition of modified product of grains of reaction product (at %) | | | Number density of grains of reaction product (grains/mm²) |
|---|---|---|---|---|---|---|---|
| | | | | Magnesium | Silicon | Oxygen | |
| Example 1 | 0.5 | 40 | 900 | 48.7 | 8.5 | 42.8 | 78 |
| Example 2 | 1.3 | 40 | 900 | 48.2 | 9.7 | 42.1 | 147 |
| Example 3 | 6.4 | 40 | 900 | 47.1 | 9.9 | 43.0 | 430 |
| Example 4 | 13 | 40 | 900 | 47.7 | 7.8 | 44.5 | 683 |
| Example 5 | 1.3 | 10 | 900 | 40.8 | 18.9 | 40.3 | 134 |
| Example 6 | 1.3 | 70 | 900 | 49.8 | 1.2 | 49.0 | 152 |
| Example 7 | 1.3 | 75 | 900 | 51.5 | 0.9 | 47.6 | 139 |
| Example 8 | 1.3 | 40 | 750 | 44.7 | 15.3 | 40.0 | 143 |
| Example 9 | 1.3 | 40 | 950 | 49.1 | 6.8 | 44.1 | 137 |
| Comparative Example 1 | 16.6 | 40 | 900 | 52.3 | 6.6 | 41.1 | 883 |
| Comparative Example 2 | 1.3 | 5 | 900 | 19.2 | 25.4 | 55.4 | 161 |
| Comparative Example 3 | 1.3 | 40 | 700 | 29.5 | 23.8 | 46.7 | 159 |
| Comparative Example 4 | 1.3 | 40 | 990 | — | — | — | — |
| Comparative Example 5 | 0 | 40 | 900 | — | — | — | 0 |

TABLE 2

| | Seebeck coefficient at 550° C. (×10⁻⁴ V/K) | Electric conductivity at 550° C. (×10⁻³ S/m) | Power factor at 550° C. (×10⁻⁴) | HV | Difference in lattice constant between example and raw material powder (Å) | Proportion of Si phase, MgO phase, and $Mg_2Si$ phase (% by mass) | | |
|---|---|---|---|---|---|---|---|---|
| | | | | | | Si | MgO | $Mg_2Si$ |
| Example 1 | −2.16 | 117.49 | 54.56 | 410 | 0.000556 | 1.054 | 5.511 | 93.435 |
| Example 2 | −2.30 | 212.77 | 112.85 | 422 | 0.000993 | 3.019 | 9.405 | 87.560 |

TABLE 2-continued

| | Seebeck coefficient at 550° C. (×10⁻⁴ V/K) | Electric conductivity at 550° C. (×10⁻³ S/m) | Power factor at 550° C. (×10⁻⁴) | HV | Difference in lattice constant between example and raw material powder (Å) | Proportion of Si phase, MgO phase, and Mg₂Si phase (% by mass) | | |
|---|---|---|---|---|---|---|---|---|
| | | | | | | Si | MgO | Mg₂Si |
| Example 3 | −2.12 | 96.29 | 43.32 | 443 | 0.001370 | 3.356 | 10.581 | 86.063 |
| Example 4 | −2.20 | 64.20 | 31.19 | 486 | 0.002248 | 6.123 | 17.928 | 75.949 |
| Example 5 | −2.07 | 70.50 | 30.21 | 411 | 0.000608 | 2.544 | 7.956 | 89.000 |
| Example 6 | −2.20 | 167.00 | 80.46 | 430 | 0.009990 | 3.024 | 9.422 | 87.544 |
| Example 7 | −2.16 | 67.10 | 31.31 | 420 | 0.001053 | 3.054 | 9.431 | 87.515 |
| Example 8 | −2.02 | 74.10 | 30.24 | 413 | 0.000500 | 2.001 | 6.335 | 91.664 |
| Example 9 | −2.17 | 93.20 | 43.89 | 435 | 0.001191 | 3.078 | 9.477 | 87.445 |
| Comparative Example 1 | −2.09 | 33.20 | 14.49 | 475 | 0.003576 | 7.601 | 21.550 | 70.849 |
| Comparative Example 2 | −1.96 | 31.67 | 12.19 | 350 | 0.000034 | 2.353 | 7.246 | 90.401 |
| Comparative Example 3 | −1.98 | 4.09 | 1.61 | 399 | 0.000304 | 0.901 | 4.887 | 94.121 |
| Comparative Example 4 | — | — | — | — | — | — | — | — |
| Comparative Example 5 | −2.21 | 60.30 | 29.45 | 401 | −0.000254 | 0.642 | 4.218 | 95.140 |

From Tables 1 and 2, it was confirmed that the addition of SiO₂ increased the HV value. Furthermore, it was confirmed that the addition of SiO₂ increased the electric conductivity (decreased the electric resistance). Accordingly, it was confirmed that by adding SiO₂ to the Mg₂Si powder and sintering the mixture, the strength was improved, a thermoelectric conversion material having low electric resistance could be formed without damage even in a vibrating environment, and the yield at the time of manufacturing the thermoelectric conversion material was improved.

In Comparative Example 4 in which the maximum temperature was set to be 990° C., the thermoelectric conversion material cracked after sintering, and hence the material could not be evaluated.

Figure 9:
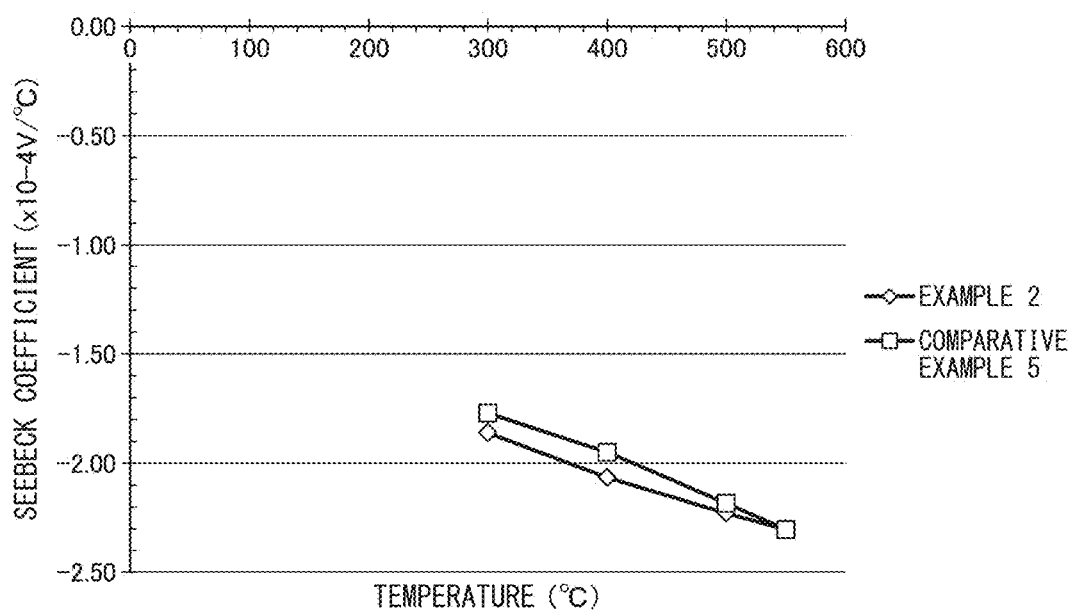
FIG. 9 is a graph showing Seebeck coefficients of an example and a comparative example at each temperature.

FIG. 9 is a view obtained by graphing Seebeck coefficients of Example 2 and Comparative Example 5 at each temperature (300° C., 400° C., 500° C., and 550° C.). Specifically, the view is obtained in a manner in which the temperature of the low-temperature sides was set to be 20° C., 30° C., and 40° C. lower than the temperature of the high-temperature sides (300° C., 400° C., 500° C., and 550° C.) such that a temperature difference was caused between the measurement points of the sample, a linear approximation of the graph of the actually measured temperature difference and electromotive force was determined, the slope of the linear approximation was taken as a Seebeck coefficient, and the Seebeck coefficient obtained at each temperature was graphed. The Seebeck coefficient is a coefficient showing the relationship between the temperature difference, which is made between one surface and the other surface of the thermoelectric conversion material, and the occurring potential difference. The larger the absolute value of the Seebeck coefficient, the better the thermoelectric conversion characteristics. From FIG. 9, it was understood that there was no big difference between Example 2 and Comparative Example 5 in terms of the Seebeck coefficient, which showed that the addition of SiO₂ did not greatly affect the Seebeck coefficient.

Figure 10:
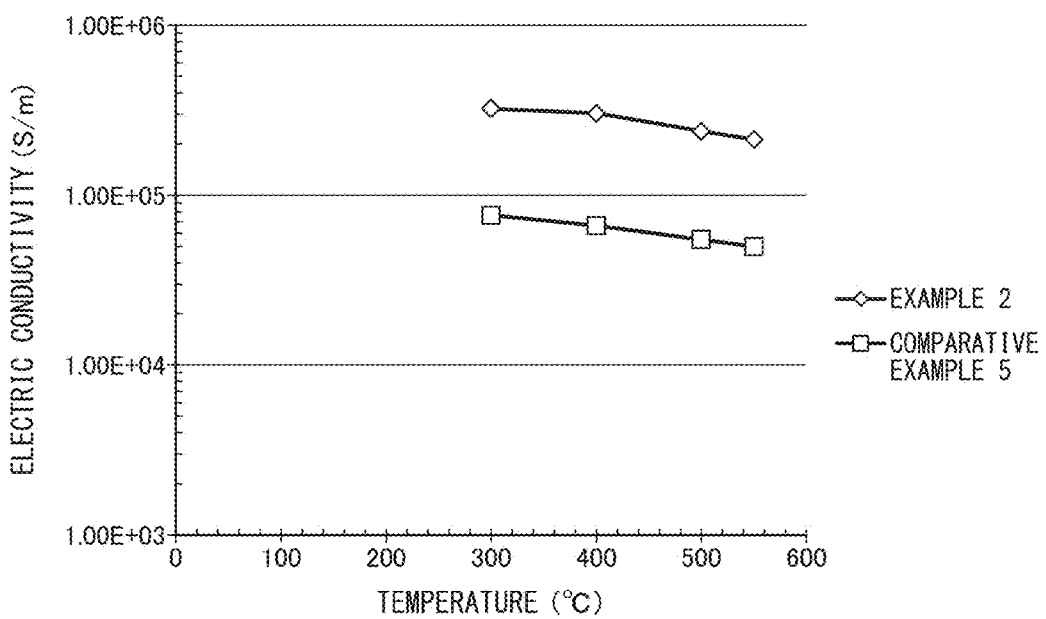
FIG. 10 is a graph showing electrical conductivity of an example and a comparative example at each temperature.

FIG. 10 is a view obtained by graphing the electric conductivity of Example 2 and Comparative Example 5 at each temperature. From the results shown in FIG. 10, it was confirmed that at any of the temperatures of 300° C., 400° C., 500° C., and 550° C., Example 2 in which SiO₂ was added to the Mg₂Si powder exhibited electric conductivity higher than that of Comparative Example 5 not containing SiO₂.

Figure 11:
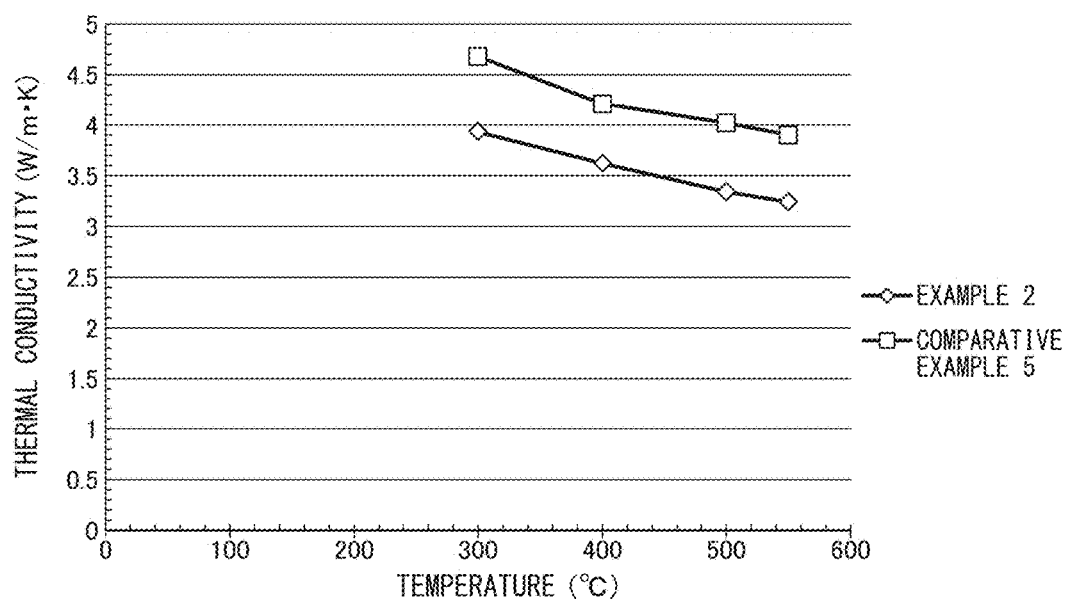
FIG. 11 is a graph showing thermal conductivity of an example and a comparative example at each temperature.

FIG. 11 is a view obtained by graphing the thermal conductivity of Example 2 and Comparative Example 5 at each temperature. The thermal conductivity was obtained by thermal diffusivity×density×specific heat capacity. The thermal diffusivity was measured using a thermal constant measuring device (model TC-7000 manufactured by Shinku-Riko Inc), the density was measured using the Archimedes' method, and the specific heat was measured using a differential scanning calorimeter (model DSC-7 manufactured by PerkinElmer Inc).

From the results shown in FIG. 11, it was understood that compared to Comparative Example 5 to which SiO₂ was not added, Example 2 to which SiO₂ was added exhibited the reduction of the thermal conductivity of the sample.

Figure 12:
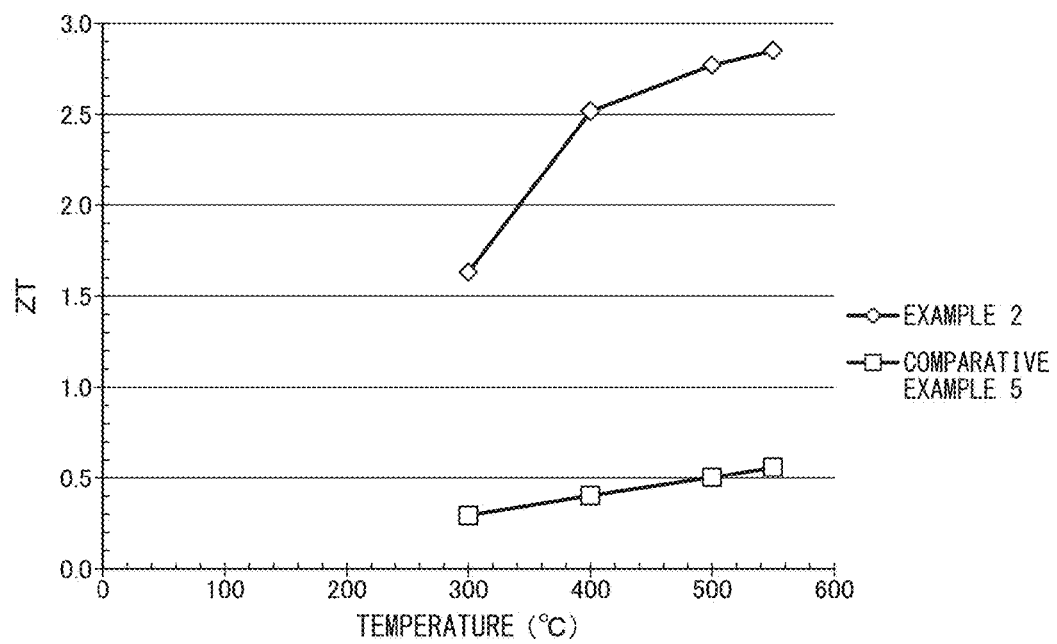
FIG. 12 is a graph showing ZT of an example and a comparative example at each temperature.

From the measurement results described above, the results of the figure of merit ZT of Example 2 and Comparative Example 5 are graphed and shown in FIG. 12. Herein, ZT is represented by $ZT=(S^2\sigma/k)T$. k represents a thermal conductivity, and T represents an absolute temperature.

As is evident from the results shown in FIG. 12, at any of the temperatures of 300° C., 400° C., 500° C., and 550° C., in Example 2 to which SiO₂ was added, the figure of merit ZT of the thermoelectric conversion material was much higher than that in Comparative Example 5 to which SiO₂ was not added. From this result, it was confirmed that a thermoelectric conversion material having thermoelectric conversion characteristics excellent in electric characteristics can be formed.

INDUSTRIAL APPLICABILITY

According to the present invention, it is possible to provide a magnesium-based thermoelectric conversion material, a magnesium-based thermoelectric conversion element, and a thermoelectric conversion device which have high thermoelectric conversion efficiency and excellent mechanical strength and are suitable for a thermoelectric generation device.

REFERENCE SIGNS LIST 10 magnesium silicide-based thermoelectric conversion element (thermoelectric conversion element)
11 magnesium silicide-based thermoelectric conversion material (thermoelectric conversion material)
12a, 12b electrode

The invention claimed is:

1. A method for manufacturing a magnesium-based thermoelectric conversion material, comprising:
   a raw material-forming step of forming a raw material for sintering by adding silicon oxide in an amount within a range equal to or greater than 0.5 mol % and equal to or smaller than 13.0 mol % to a magnesium-based compound; and
   a sintering step of heating the raw material for sintering at a temperature within a range equal to or higher than 750° C. and equal to or lower than 950° C. while applying pressure equal to or higher than 10 MPa to the raw material for sintering so as to form a sintered substance.

2. The method for manufacturing a magnesium-based thermoelectric conversion material according to claim 1,
   wherein the magnesium-based compound is any one of $Mg_xSi_y$, $Mg_2Si_{1-x}Ge_x$, and $Mg_2Si_{1-x}Sn_x$.

3. The method for manufacturing a magnesium-based thermoelectric conversion material according to claim 1,
   wherein the raw material for sintering further contains, as a dopant, at least one kind of element among Li, Na, K, B, Al, Ga, In, N, P, As, Sb, Bi, Ag, Cu, and Y.

4. The method for manufacturing a magnesium-based thermoelectric conversion material according to claim 1,
   wherein the sintering step is performed by any of a hot pressing method, a hot isostatic pressing method, a discharge plasma sintering method, an energizing sintering method, a hot rolling method, a hot extrusion method, and a hot forging method.

5. The method for manufacturing a magnesium-based thermoelectric conversion material according to claim 1,
   wherein the sintering step is performed in a vacuum atmosphere under a pressure equal to or lower than 5 Pa or in an inert gas atmosphere.

6. A method for manufacturing a magnesium-based thermoelectric conversion element, comprising:
   an electrode-forming step of joining electrodes to one surface and the other surface, facing the one surface, of the sintered substance obtained by the method for manufacturing a magnesium-based thermoelectric conversion material according to claim 1 respectively.

7. A magnesium-based thermoelectric conversion material, comprising:
   a sintered substance of a magnesium-based compound,
   wherein grains of a reaction product are present in the sintered substance,
   each of the grains of the reaction product is constituted with a modified product and a high-concentration silicon region formed on the periphery of the modified product,
   the modified product contains magnesium at a concentration within a range equal to or higher than 30 at % and equal to or lower than 50 at %, silicon at a concentration within a range equal to or higher than 0 at % and equal to or lower than 20 at %, and oxygen at a concentration within a range equal to or higher than 40 at % and equal to or lower than 55 at %, and
   a number density of the grains of the reaction product is equal to or higher than 50 grains/mm$^2$ and equal to or lower than 700 grains/mm$^2$.

8. The magnesium-based thermoelectric conversion material according to claim 7,
   wherein a average grain size of the grains of the reaction product is equal to or greater than 0.5 μm and equal to or smaller than 100 μm.

9. The magnesium-based thermoelectric conversion material according to claim 7,
   wherein on a grain boundary of grain of the magnesium-based compound, a Si-rich phase having a Si concentration higher than that in the grain of the magnesium-based compound is formed.

10. The magnesium-based thermoelectric conversion material according to claim 7,
    wherein a lattice constant difference obtained by subtracting a lattice constant of raw material powder formed of the magnesium-based compound from a lattice constant of the magnesium-based thermoelectric conversion material (lattice constant of magnesium-based thermoelectric conversion material—lattice constant of raw material powder formed of magnesium-based compound) is equal to or greater than 0.0005 angstrom (Å).

11. A magnesium-based thermoelectric conversion element, comprising:
    the magnesium-based thermoelectric conversion material according to claim 7; and
    electrodes joined to one surface and the other surface, facing the one surface, of the magnesium-based thermoelectric conversion material respectively.

12. The magnesium-based thermoelectric conversion element according to claim 11,
    wherein the magnesium-based thermoelectric conversion element is a Seebeck element in which the one surface or the other surface of the magnesium-based thermoelectric conversion material is heated such that a potential difference is caused between the electrodes.

13. The magnesium-based thermoelectric conversion element according to claim 11,
    wherein the magnesium-based thermoelectric conversion element is a Peltier element in which voltage is applied between the electrodes such that the one surface or the other surface of the magnesium-based thermoelectric conversion material is cooled.

14. A thermoelectric conversion device, comprising:
    a plurality of the magnesium-based thermoelectric conversion elements according to claim 11,
    wherein the magnesium-based thermoelectric conversion elements are arranged and electrically connected to each other in series through the electrodes.

15. The thermoelectric conversion device according to claim 14,
    wherein the magnesium-based thermoelectric conversion elements include p-type thermoelectric conversion elements and n-type thermoelectric conversion elements including the magnesium-based thermoelectric conversion material containing a donor, and
    the n-type thermoelectric conversion elements and the p-type thermoelectric conversion elements are alternately connected to each other in series.

16. The thermoelectric conversion device according to claim 14,
    wherein the magnesium-based thermoelectric conversion elements are formed of n-type thermoelectric conversion elements including the magnesium-based thermoelectric conversion material containing a donor or p-type thermoelectric conversion elements including the magnesium-based thermoelectric conversion material containing an acceptor, and the n-type thermoelectric conversion elements or the p-type thermoelectric conversion elements are connected to each other in series.

* * * * *